United States Patent
D'Evelyn

(10) Patent No.: US 8,444,765 B2
(45) Date of Patent: *May 21, 2013

(54) PROCESS AND APPARATUS FOR LARGE-SCALE MANUFACTURING OF BULK MONOCRYSTALLINE GALLIUM-CONTAINING NITRIDE

(75) Inventor: Mark P. D'Evelyn, Goleta, CA (US)

(73) Assignee: Soraa, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/226,249

(22) Filed: Sep. 6, 2011

(65) Prior Publication Data

US 2012/0073494 A1    Mar. 29, 2012

Related U.S. Application Data

(63) Continuation of application No. 12/534,857, filed on Aug. 4, 2009, now Pat. No. 8,021,481.

(60) Provisional application No. 61/086,801, filed on Aug. 7, 2008.

(51) Int. Cl.
    *C30B 7/10*    (2006.01)
(52) U.S. Cl.
    USPC .............. 117/70; 117/105; 117/108; 117/109
(58) Field of Classification Search
    USPC .................................. 117/108, 109, 105, 70
    See application file for complete search history.

(56) References Cited

U.S. PATENT DOCUMENTS

| | | | |
|---|---|---|---|
| 3,245,760 A | 4/1966 | Sawyer | |
| 3,303,053 A | 2/1967 | Strong et al. | |
| 3,335,084 A | 8/1967 | Hall | |
| 4,030,966 A | 6/1977 | Hornig et al. | |
| 4,430,051 A | 2/1984 | Von Platen | |
| 5,868,837 A | 2/1999 | DiSalvo et al. | |
| 6,090,202 A | 7/2000 | Klipov | |
| 6,129,900 A | 10/2000 | Satoh et al. | |
| 6,152,977 A | 11/2000 | D'Evelyn | |
| 6,350,191 B1 | 2/2002 | D'Evelyn | |
| 6,372,002 B1 | 4/2002 | D'Evelyn et al. | |
| 6,398,867 B1 | 6/2002 | D'Evelyn et al. | |
| 6,406,776 B1 | 6/2002 | D'Evelyn | |
| 6,455,877 B1 | 9/2002 | Ogawa et al. | |

(Continued)

FOREIGN PATENT DOCUMENTS

| | | |
|---|---|---|
| JP | 2005-289797 A2 | 10/2005 |
| JP | 2007-039321 A | 2/2007 |

(Continued)

OTHER PUBLICATIONS

Byrappa et al., "Handbook of Hydrothermal Technology: A Technology for Crystal Growth and Materials Processing," Noyes Publications, Park Ridge, New Jersey, 2001, pp. 94-96 and 152.

(Continued)

*Primary Examiner* — Bob M Kunemund
(74) *Attorney, Agent, or Firm* — Kilpatrick Townsend & Stockton LLP

(57) ABSTRACT

A method for large-scale manufacturing of gallium nitride includes a process for reducing and/or minimizing contamination in the crystals, for solvent addition to an autoclave, for improving or optimizing the solvent atmosphere composition, for removal of the solvent from the autoclave, and for recycling of the solvent. The method is scalable up to large volumes and is cost effective.

18 Claims, 9 Drawing Sheets

U.S. PATENT DOCUMENTS

| | | |
|---|---|---|
| 6,475,254 B1 | 11/2002 | Saak et al. |
| 6,533,874 B1 | 3/2003 | Vaudo et al. |
| 6,541,115 B2 | 4/2003 | Pender et al. |
| 6,596,040 B2 | 7/2003 | Kim et al. |
| 6,596,079 B1 | 7/2003 | Vaudo et al. |
| 6,639,925 B2 | 10/2003 | Niwa et al. |
| 6,656,615 B2 | 12/2003 | Dwilinski et al. |
| 6,764,297 B2 | 7/2004 | Godwin et al. |
| 6,765,240 B2 | 7/2004 | Tischler et al. |
| 6,784,463 B2 | 8/2004 | Camras et al. |
| 6,787,814 B2 | 9/2004 | Udagawa |
| 6,806,508 B2 | 10/2004 | D'Evelyn et al. |
| 6,858,882 B2 | 2/2005 | Tsuda et al. |
| 6,861,130 B2 | 3/2005 | D'Evelyn et al. |
| 6,936,488 B2 | 8/2005 | D'Evelyn et al. |
| 6,955,719 B2 | 10/2005 | Dmitriev et al. |
| 7,001,577 B2 | 2/2006 | Zimmerman et al. |
| 7,009,199 B2 | 3/2006 | Hall |
| 7,009,215 B2 | 3/2006 | D'Evelyn et al. |
| 7,012,279 B2 | 3/2006 | Wierer Jr. et al. |
| 7,026,755 B2 | 4/2006 | Setlur et al. |
| 7,033,858 B2 | 4/2006 | Chai et al. |
| 7,053,413 B2 | 5/2006 | D'Evelyn et al. |
| 7,063,741 B2 | 6/2006 | D'Evelyn et al. |
| 7,067,407 B2 | 6/2006 | Kostamo et al. |
| 7,078,731 B2 | 7/2006 | D'Evelyn et al. |
| 7,098,487 B2 | 8/2006 | D'Evelyn et al. |
| 7,101,433 B2 | 9/2006 | D'Evelyn et al. |
| 7,102,158 B2 | 9/2006 | Tysoe et al. |
| 7,105,865 B2 | 9/2006 | Nakahata et al. |
| 7,112,829 B2 | 9/2006 | Picard et al. |
| 7,119,372 B2 | 10/2006 | Stokes et al. |
| 7,122,827 B2 | 10/2006 | Alizadeh et al. |
| 7,125,453 B2 | 10/2006 | D'Evelyn et al. |
| 7,160,388 B2 | 1/2007 | Dwilinski et al. |
| 7,160,531 B1 | 1/2007 | Jacques et al. |
| 7,175,704 B2 | 2/2007 | D'Evelyn et al. |
| 7,198,671 B2 | 4/2007 | Ueda |
| 7,208,393 B2 | 4/2007 | Haskell et al. |
| 7,220,658 B2 | 5/2007 | Haskell et al. |
| 7,252,712 B2 | 8/2007 | Dwilinski et al. |
| 7,285,801 B2 | 10/2007 | Eliashevich et al. |
| 7,291,544 B2 | 11/2007 | D'Evelyn et al. |
| 7,316,746 B2 | 1/2008 | D'Evelyn et al. |
| 7,329,371 B2 | 2/2008 | Setlur et al. |
| 7,335,262 B2 | 2/2008 | Dwilinski et al. |
| 7,338,828 B2 | 3/2008 | Imer et al. |
| 7,358,542 B2 | 4/2008 | Radkov et al. |
| 7,364,619 B2 | 4/2008 | Dwilinski et al. |
| 7,368,015 B2 | 5/2008 | D'Evelyn et al. |
| 7,381,391 B2 | 6/2008 | Spencer et al. |
| 7,420,261 B2 | 9/2008 | Dwili ski et al. |
| 7,572,425 B2 | 8/2009 | McNulty et al. |
| 7,625,446 B2 | 12/2009 | D'Evelyn et al. |
| 7,642,122 B2 | 1/2010 | Tysoe et al. |
| 7,704,324 B2 | 4/2010 | D'Evelyn et al. |
| 7,705,276 B2 | 4/2010 | Giddings et al. |
| 7,759,710 B1 | 7/2010 | Chiu et al. |
| 7,871,839 B2 | 1/2011 | Lee et al. |
| 7,976,630 B2 | 7/2011 | Poblenz et al. |
| 8,048,225 B2 | 11/2011 | Poblenz et al. |
| 8,097,081 B2 | 1/2012 | D'Evelyn |
| 8,148,801 B2 | 4/2012 | D'Evelyn |
| 8,188,504 B2 | 5/2012 | Lee |
| 8,198,643 B2 | 6/2012 | Lee et al. |
| 8,207,548 B2 | 6/2012 | Nagai |
| 8,284,810 B1 | 10/2012 | Sharma et al. |
| 8,299,473 B1 | 10/2012 | D'Evelyn et al. |
| 8,303,710 B2 | 11/2012 | D'Evelyn |
| 8,306,081 B1 | 11/2012 | Schmidt et al. |
| 8,323,405 B2 | 12/2012 | D'Evelyn |
| 8,329,511 B2 | 12/2012 | D'Evelyn |
| 2001/0009134 A1 | 7/2001 | Kim et al. |
| 2001/0011935 A1 | 8/2001 | Lee et al. |
| 2001/0048114 A1 | 12/2001 | Morita et al. |
| 2002/0070416 A1 | 6/2002 | Morse et al. |
| 2002/0105986 A1 | 8/2002 | Yamasaki |
| 2002/0182768 A1 | 12/2002 | Morse et al. |
| 2002/0189532 A1 | 12/2002 | Motoki et al. |
| 2003/0027014 A1 | 2/2003 | Johnson et al. |
| 2003/0140845 A1 | 7/2003 | D'Evelyn et al. |
| 2003/0145784 A1 | 8/2003 | Thompson et al. |
| 2003/0164507 A1 | 9/2003 | Edmond et al. |
| 2003/0183155 A1 | 10/2003 | D'Evelyn et al. |
| 2003/0209191 A1 | 11/2003 | Purdy |
| 2003/0232512 A1 | 12/2003 | Dickinson et al. |
| 2004/0000266 A1 | 1/2004 | D'Evelyn et al. |
| 2004/0023427 A1 | 2/2004 | Chua et al. |
| 2004/0104391 A1 | 6/2004 | Maeda et al. |
| 2004/0124435 A1 | 7/2004 | D'Evelyn et al. |
| 2004/0161222 A1 | 8/2004 | Niida et al. |
| 2004/0222357 A1 | 11/2004 | King et al. |
| 2005/0087753 A1 | 4/2005 | D'Evelyn et al. |
| 2005/0098095 A1 | 5/2005 | D'Evelyn et al. |
| 2005/0109240 A1 | 5/2005 | Maeta et al. |
| 2005/0121679 A1 | 6/2005 | Nagahama et al. |
| 2005/0128469 A1 | 6/2005 | Hall et al. |
| 2005/0152820 A1 | 7/2005 | D'Evelyn et al. |
| 2005/0167680 A1 | 8/2005 | Shei et al. |
| 2005/0191773 A1 | 9/2005 | Suzuki et al. |
| 2005/0205215 A1 | 9/2005 | Giddings et al. |
| 2005/0263791 A1 | 12/2005 | Yanagihara et al. |
| 2006/0030738 A1 | 2/2006 | Vanmaele et al. |
| 2006/0032428 A1 | 2/2006 | Dwilinski et al. |
| 2006/0037529 A1 | 2/2006 | D'Evelyn et al. |
| 2006/0037530 A1 | 2/2006 | Dwilinski et al. |
| 2006/0038193 A1 | 2/2006 | Wu et al. |
| 2006/0048699 A1 | 3/2006 | D'Evelyn et al. |
| 2006/0096521 A1 | 5/2006 | D'Evelyn et al. |
| 2006/0118799 A1 | 6/2006 | D'Evelyn et al. |
| 2006/0163589 A1 | 7/2006 | Fan et al. |
| 2006/0169993 A1 | 8/2006 | Fan et al. |
| 2006/0177362 A1 | 8/2006 | D'Evelyn et al. |
| 2006/0207497 A1 | 9/2006 | D'Evelyn et al. |
| 2006/0213429 A1 | 9/2006 | Motoki et al. |
| 2006/0214287 A1 | 9/2006 | Ogihara et al. |
| 2006/0228870 A1 | 10/2006 | Oshima |
| 2006/0246687 A1 | 11/2006 | Kaiser et al. |
| 2006/0255343 A1 | 11/2006 | Ogihara et al. |
| 2006/0289386 A1 | 12/2006 | Tysoe et al. |
| 2007/0015345 A1 | 1/2007 | Baker et al. |
| 2007/0057337 A1 | 3/2007 | Kano et al. |
| 2007/0077674 A1 | 4/2007 | Okuyama et al. |
| 2007/0096239 A1 | 5/2007 | Cao et al. |
| 2007/0105351 A1 | 5/2007 | Motoki et al. |
| 2007/0114569 A1 | 5/2007 | Wu et al. |
| 2007/0121690 A1 | 5/2007 | Fujii et al. |
| 2007/0131967 A1 | 6/2007 | Kawaguchi et al. |
| 2007/0141819 A1 | 6/2007 | Park et al. |
| 2007/0142204 A1 | 6/2007 | Park et al. |
| 2007/0151509 A1 | 7/2007 | Park et al. |
| 2007/0158785 A1 | 7/2007 | D'Evelyn et al. |
| 2007/0164292 A1 | 7/2007 | Okuyama |
| 2007/0166853 A1 | 7/2007 | Guenther et al. |
| 2007/0178039 A1 | 8/2007 | D'Evelyn et al. |
| 2007/0181056 A1 | 8/2007 | D'Evelyn et al. |
| 2007/0190758 A1 | 8/2007 | Kaeding et al. |
| 2007/0197004 A1 | 8/2007 | Dadgar et al. |
| 2007/0210074 A1 | 9/2007 | Maurer et al. |
| 2007/0215033 A1 | 9/2007 | Imaeda et al. |
| 2007/0228404 A1 | 10/2007 | Tran et al. |
| 2007/0234946 A1 | 10/2007 | Hashimoto et al. |
| 2007/0252164 A1 | 11/2007 | Zhong et al. |
| 2007/0274359 A1 | 11/2007 | Takeuchi et al. |
| 2007/0290224 A1 | 12/2007 | Ogawa |
| 2008/0006831 A1 | 1/2008 | Ng |
| 2008/0008855 A1 | 1/2008 | D'Evelyn et al. |
| 2008/0023691 A1 | 1/2008 | Jang et al. |
| 2008/0025360 A1 | 1/2008 | Eichler et al. |
| 2008/0073660 A1 | 3/2008 | Ohno et al. |
| 2008/0083741 A1 | 4/2008 | Giddings et al. |
| 2008/0083929 A1 | 4/2008 | Fan et al. |
| 2008/0087919 A1 | 4/2008 | Tysoe et al. |
| 2008/0106212 A1 | 5/2008 | Yen et al. |
| 2008/0121906 A1 | 5/2008 | Yakushiji |
| 2008/0128752 A1 | 6/2008 | Wu |
| 2008/0156254 A1 | 7/2008 | Dwilinski et al. |

| | | | |
|---|---|---|---|
| 2008/0193363 A1 | 8/2008 | Tsuji | |
| 2008/0198881 A1 | 8/2008 | Farrell et al. | |
| 2008/0211416 A1 | 9/2008 | Negley et al. | |
| 2008/0230765 A1 | 9/2008 | Yoon et al. | |
| 2008/0272462 A1 | 11/2008 | Shimamoto et al. | |
| 2008/0282978 A1 | 11/2008 | Butcher et al. | |
| 2008/0285609 A1 | 11/2008 | Ohta et al. | |
| 2008/0298409 A1 | 12/2008 | Yamashita et al. | |
| 2009/0078955 A1 | 3/2009 | Fan et al. | |
| 2009/0092536 A1 | 4/2009 | Kawabata et al. | |
| 2009/0146170 A1 | 6/2009 | Zhong et al. | |
| 2009/0218593 A1 | 9/2009 | Kamikawa et al. | |
| 2009/0250686 A1 | 10/2009 | Sato et al. | |
| 2009/0301387 A1 | 12/2009 | D'Evelyn | |
| 2009/0301388 A1 | 12/2009 | D'Evelyn | |
| 2009/0309110 A1 | 12/2009 | Raring et al. | |
| 2009/0320744 A1 | 12/2009 | D'Evelyn | |
| 2009/0320745 A1 | 12/2009 | D'Evelyn et al. | |
| 2010/0001300 A1 | 1/2010 | Raring et al. | |
| 2010/0003492 A1 | 1/2010 | D'Evelyn | |
| 2010/0025656 A1 | 2/2010 | Raring et al. | |
| 2010/0031872 A1 | 2/2010 | D'Evelyn | |
| 2010/0031873 A1 | 2/2010 | D'Evelyn | |
| 2010/0031874 A1 | 2/2010 | D'Evelyn | |
| 2010/0031875 A1 | 2/2010 | D'Evelyn | |
| 2010/0031876 A1 | 2/2010 | D'Evelyn | |
| 2010/0032691 A1 | 2/2010 | Kim | |
| 2010/0108985 A1 | 5/2010 | Chung et al. | |
| 2010/0109030 A1 | 5/2010 | Krames et al. | |
| 2010/0117101 A1 | 5/2010 | Kim et al. | |
| 2010/0117118 A1 | 5/2010 | Dabiran et al. | |
| 2010/0147210 A1 | 6/2010 | D'Evelyn | |
| 2010/0151194 A1 | 6/2010 | D'Evelyn | |
| 2010/0219505 A1 | 9/2010 | D'Evelyn | |
| 2010/0295088 A1 | 11/2010 | D'Evelyn et al. | |
| 2011/0017298 A1 | 1/2011 | Lee | |
| 2011/0100291 A1 | 5/2011 | D'Evelyn | |
| 2011/0108081 A1 | 5/2011 | Werthen et al. | |
| 2011/0121331 A1 | 5/2011 | Simonian et al. | |
| 2011/0175200 A1 | 7/2011 | Yoshida | |
| 2011/0183498 A1 | 7/2011 | D'Evelyn | |
| 2011/0220912 A1 | 9/2011 | D'Evelyn | |
| 2011/0256693 A1 | 10/2011 | D'Evelyn et al. | |
| 2011/0262773 A1 | 10/2011 | Poblenz et al. | |
| 2012/0000415 A1 | 1/2012 | D'Evelyn et al. | |
| 2012/0007102 A1 | 1/2012 | Feezell et al. | |
| 2012/0091465 A1 | 4/2012 | Krames et al. | |
| 2012/0118223 A1 | 5/2012 | D'Evelyn | |
| 2012/0137966 A1 | 6/2012 | D'Evelyn et al. | |
| 2012/0187412 A1 | 7/2012 | D'Evelyn et al. | |
| 2012/0199952 A1 | 8/2012 | D'Evelyn et al. | |

FOREIGN PATENT DOCUMENTS

| | | |
|---|---|---|
| WO | WO 2005121415 A1 | 12/2005 |
| WO | 2007/004495 | 1/2007 |
| WO | 2012/016033 | 2/2012 |

OTHER PUBLICATIONS

Callahan et al., "Synthesis and Growth of Gallium Nitride by the Chemical Vapor Reaction Process (CVRP)," 1999, MRS Internet Journal Nitride Semiconductor Research, vol. 4, Issue No. 10, pp. 1-6.

Chiang et al. "Luminescent Properties of Cerium-Activated Garnet Series Phosphor: Structure and Temperature Effects," Journal of the Electrochemical Society 155:B517-B520 (2008).

Chiu et al. "Synthesis and Luminescence Properties of Intensely Red-Emitting $M_5Eu(WO_4)_{4-x}(MoO_4)_x$ (M=Li, Na, K) Phosphors," Journal of the Electrochemical Society 15:J71-J78 (2008).

Ci et al. "$Ca_{1-x}Mo_{1-y}Nb_yO_4:Eu_x^{3+}$: A novel red phosphor for white light emitting diodes," Journal of Physics 152:670-674 (2008).

D'Evelyn et al., "Bulk GaN Crystal Growth by the High-Pressure Ammonothermal Method," Journal of Crystal Growth, 2007, vol. 300, pp. 11-16.

Dwiliński et al, Ammono Method of BN, AlN, and GaN Synthesis and Crystal Growth,: Journal of Nitride Semiconductor Research, 1998, 3,25, MRS, Internet: http://nsr.mij.mrs.org.

Dwilinski et al., "Excellent Crystallinity of Truly Bulk Ammonothermal GaN," Journal of Crystal Growth, 2008, vol. 310, pp. 3911-3916.

Ehrentraut et al., "Prospects for the Ammonothermal Growth of Large GaN Crystal," Journal of Crystal Growth, 2007, vol. 305, pp. 304-310.

Farrell et al., "Continuous-wave Operation of AlGaN-cladding-free Nonpolar m-Plane InGaN/GaN Laser Diodes," 2007, Japanese Journal of Applied Physics, vol. 46, No. 32, pp. L761-L763.

Feezell et al., "AlGaN-Cladding-Free Nonpolar InGaN/GaN Laser Diodes," Japanese Journal of Applied Physics, vol. 46, No. 13, pp. L284-L286 (Mar. 2007).

Frayssinet et al., "Evidence of Free Carrier Concentration Gradient Along the c-axis for Undoped GaN Single Crystals," Journal of Crystal Growth, 2001, vol. 230, pp. 442-447.

Happek "Development of Efficient UV-LED Phosphor Coatings for Energy Saving Solid State Lighting" University of Georgia (Jan. 2007).

Hashimoto et al. "Ammonothermal growth of bulk GaN," Journal of Crystal Growth 310:3907-3910 (Aug. 2008).

Hashimoto et al. "A GaN bulk crystal wit improved structural quality grown by the ammonothermal method," Nature Materials 6:568-671 (Jul. 2007).

Hoppe et al. "Luminescence in $Eu^{2+}$-doped $Ba_2Si_5N_8$: fluorescence, thernoliminescence, and upconversion"; Journal of Physics and Chemistry of Solids 61:2001-2006 (2000).

Iso et al., "High Brightness Blue InGaN/GaN Light Emitting Diode on Nonpolar m-plane Bulk GaN Substrate," 2007, Japanese Journal of Applied Physics, vol. 46, No. 40, pp. L960-L962.

Kim et al, "Improved Electroluminescence on Nonpolar m-plane InGaN/GaN Qantum Well LEDs", 2007, Physica Status Solidi (RRL), vol. 1, No. 3, pp. 125-127.

Kojima et al., "Stimulated Emission at 474 nm from an InGaN Laser Diode Structure Grown on a (1122) GaN Substrate," 2007, Applied Physics Letter, vol. 91, No. 25, pp. 251107-251107-3.

Kolis et al., "Crystal Growth of Gallium Nitride in Supercritical Ammonia," Journal of Crystal Growth, 2001, vol. 222, pp. 431-434.

Kolis et al., "Materials Chemistry and Bulk Crystal Growth of Group III Nitrides in Supercritical Ammonia" Mat. Res. Soc. Symp. Proc., 1998, vol. 495, pp. 367-372.

Kubota et al., "Temperature Dependence of Polarized Photoluminescence from Nonpolar m-plane InGaN Multiple Quantum Wells for Blue Laser Diodes" 2008, Applied Physics Letter, vol. 92, pp. 011920-011920-3.

Li et al. "The effect of replacement of Sr by Ca on the structural and luminescence properties of the redemitting $Sr_2Si_5N_8:Eu_2+$ LED conversion phosphor," Journal of Solid State Chemistry 181:515-524 (2008).

Mirwald et al., "Low-Friction Cell for Piston-Cylinder High Pressure Apparatus," Journal of Geophysical Research, 1975, vol. 80, No. 11, pp. 1519-1525.

Motoki et al. "Growth and Characterization of Freestanding GaN Substrates," Journal of Crystal Growth, 2002, vol. 237-239, pp. 912-921.

Mueller-Mach et al. "Highly efficient all-nitride phosphor-converted white light emitting diode," Physica Status Solidi (a) 202:1727-1732 (Jul. 2005).

Murota et al., "Solid State Light Source Fabricated with YAG:Ce Single Crystal," 2002, Japanese Journal of Applied Physics, vol. 46, No. 41, Part 2, No. 8A, pp. L887-L888.

Okamoto et al., "Continuous-Wave Operation of m-Plane InGaN Multiple Quantum Well Laser Diodes," 2007, Japanese Journal of Applied Physics, vol. 46, No. 9, pp. L187-L189.

Okamoto et al., "Pure Blue Laser Diodes Based on Nonpolar m-Plane Gallium Nitride with InGaN Waveguiding Layers," 2007, Japanese Journal of Applied Physics, vol. 46, No. 35, pp. L820-L822.

Oshima et al., "Thermal and Optical Properties of Bulk GaN Crystals Fabricated Through Hydride Vapor Phase Epitaxy with Void-Assisted Separation," 2005, Journal of Applied Physics, vol. 98, pp. 103509-1-103509-3.

Peters, "Ammonothermal Synthesis of Aluminium Nitride," Journal of Crystal Growth, 1999, vol. 4, pp. 411-418.

Sarva, et al. "Dynamic compressive strength of silicon carbide under uniaxial compression," Mat. Sci. & Eng. A 317,140 (2001).

Sato et al., "High Power and High Efficiency Green Light Emitting Diode on free-Standing Semipolar (1122) Bulk GaN Substrate," 2007.Physica Status Solidi (RRL, vol. 1, pp. 162-164.

Sato et al., "Optical Properties of Yellow Light-Emitting-Diodes Grown on Semipolar (1122) Bulk GaN Substrate," 2008, Applied Physics Letter, vol. 92, No. 22, pp. 221110-1-221110-3.

Schmidt et al., "Demonstration of Nonpolar m-Plane InGaN/GaN Laser Diodes ," 2007, Japanese Journal of Applied Physics, vol. 46, No. 9, L190-L191.

Setlur et al. "Crystal chemistry and luminescence of $Ce^{3+}$-doped $(Lu_2CaMg_2)$-Ca-2(Si, Ge)$_{O12}$ and its use in LED based lighting," Chemistry of Materials 18: 3314-3322 (2006).

Sizov et al., "500-nm Optical Gain Anisotropy of Semipolar (1122) InGaN Quantum Wells," 2009, Applied Physics Express, vol. 2, pp. 071001-1-071001-3.

Tsuda et al., "Blue Laser Diodes Fabricated on m-Plane GaN Substrates," 2008, Applied Physics Express, vol. 1, pp. 011104-011104-03.

Tyagi et al., "Semipolar (1011) InGaN/GaN Laser Diodes on Bulk GaN Substrates," 2007, Japanese Journal of Applied Physics, vol. 46, No. 19, pp. L444-L445.

Wang et al. "Ammonothermal growth of GaN crystals in alkaline solutions," Journal of crystal Growth 287:376-380 (Jan. 2006).

Wang et al. "New red $Y_{0.85}Bi_{0.1}Eu_{0.05}V_{1-y}M_yO_4$ (M=Nb, P) phosphors for light-emitting diodes," Physica B: Condensed Matter 403:2071-2075 (Jun. 2008).

Wang et al., "Ammonothermal Synthesis of III-Nitride Crystals," Crystal Growth & Design, 2006, vol. 6, Issue No. 6, pp. 1227-1246.

Wang et al., "Synthesis of Dense Polycrystaline GaN of High Purity by the Chemical Vapor Reaction Process," Journal of Crystal Growth, 2006, vol. 286, pp. 50-54.

Yamamoto "White LED phosphors: the next step," Proceeding of . SPIE (2010).

Yang et al. "Preparation and luminescence properties of LED conversion novel phosphors $SrZnO_2$:Sm," Materials Letters 62:907-910 (Mar. 2008).

Zhong et al., "Demonstration of High Power Blue-Green Light Emitting Diode on Semipolar (1122) Bulk GaN Substrate," 2007, Electron Letter, vol. 43, No. 15, pp. 825-826.

Zhong et al., "High Power and High Efficiency Blue Light Emitting Diode on Freestanding Semipolar (1122) Bulk GaN Substrate," 2007, Applied Physics Letter, vol. 90, No. 23, pp. 233504-233504-3.

Office action for U.S. Appl. No. 12/497,969 (Feb. 2, 2012).

Office action for U.S. Appl. No. 12/478,736 (Feb. 7, 2012).

Office action for U.S. Appl. No. 12/569,841 (Dec. 23, 2011).

Office action for U.S. Appl. No. 12/724,983 (Mar. 5, 2012).

Office action for U.S. Appl. No. 12/785,404 (Mar. 6, 2012).

Office action for U.S. Appl. No. 12/491,176 (Mar. 1, 2012).

Fukuda et al. "Prospects for the ammonothermal growth of large GaN crystal," Journal of Crystal Growth 305: 304-310 (Jul. 2007).

Choi et al., '2.5λ microcavity InGaN light-emitting diodes fabricated by a selective dry-etch thinning process', Applied Physics Letters, 2007, 91(6), 061120.

Lide et al., 'Thermal Conductivity of Ceramics and Other Insulating Materials,' CRC Handbook of Chemistry and Physics, 91st Edition, 2010-2011, pp. 12-203 and 12-204.

http://www.matbase.com/material/non-ferrous-metals/other/molybdenum/properties, Data Table for: Non-Ferrous Metals: Other Metals: Molybdenum, Mar. 28, 2011, pp. 1.

Pattison et al., 'Gallium Nitride Based Microcavity Light Emitting Diodes With 2λ Effective Cavity Thickness', Applied Physics Letters, vol. 90, Issue 3, 031111 (2007) 3pg.

Weisbuch et al., 'Recent results and latest views on microcavity LEDs', Light-Emitting Diodes: Research, Manufacturing, and Applications VIII, ed. By S.A. Stockman et al., Proc. SPIE, vol. 5366, p. 1-19 (2004).

USPTO Office Action for U.S. Appl. No. 12/133,364 dated Nov. 26, 2010.

USPTO Office Action for U.S. Appl. No. 12/133,364 dated Jun. 1, 2011.

USPTO Notice of Allowance for U.S. Appl. No. 12/133,364 dated Oct. 11, 2011.

USPTO Office Action for U.S. Appl. No. 12/133,365 dated Jun. 9, 2011.

USPTO Office Action for U.S. Appl. No. 12/133,365 dated Oct. 18, 2011.

USPTO Office Action for U.S. Appl. No. 12/334,418 dated Apr. 5, 2011.

USPTO Office Action for U.S. Appl. No. 12/334,418 dated Oct. 19, 2011.

USPTO Office Action for U.S. Appl. No. 12/478,736 dated Sep. 27, 2011.

USPTO Notice of Allowance for U.S. Appl. No. 12/478,736 dated Apr. 23, 2012.

USPTO Notice of Allowance for U.S. Appl. No. 12/478,736 dated Oct. 9, 2012.

USPTO Office Action for U.S. Appl. No. 12/484,095 dated Nov. 10, 2010.

USPTO Office Action for U.S. Appl. No. 12/484,095 dated Jul. 8, 2011.

USPTO Office Action for U.S. Appl. No. 12/497,969 dated Jul. 5, 2012.

USPTO Office Action for U.S. Appl. No. 12/534,838 dated May 3, 2011.

USPTO Office Action for U.S. Appl. No. 12/534,838 dated Jan. 13, 2012.

USPTO Office Action for U.S. Appl. No. 12/534,838 dated Mar. 20, 2012.

USPTO Notice of Allowance for U.S. Appl. No. 12/534,838 dated Jun. 8, 2012.

USPTO Office Action for U.S. Appl. No. 12/534,843 dated Sep. 10, 2012.

USPTO Office Action for U.S. Appl. No. 12/534,844 dated Sep. 16, 2010.

USPTO Office Action for U.S. Appl. No. 12/534,844 dated Feb. 4, 2011.

USPTO Notice of Allowance for U.S. Appl. No. 12/534,849 dated Jul. 31, 2012.

USPTO Office Action for U.S. Appl. No. 12/546,458 dated Jul. 20, 2011.

USPTO Notice of Allowance for U.S. Appl. No. 12/546,458 dated Nov. 28, 2011.

USPTO Office Action for U.S. Appl. No. 12/556,558 dated Sep. 16, 2010.

USPTO Notice of Allowance for U.S. Appl. No. 12/556,558 dated Mar. 22, 2011.

USPTO Office Action for U.S. Appl. No. 12/556,562 dated Sep. 15, 2010.

USPTO Office Action for U.S. Appl. No. dated Mar. 21, 2011.

USPTO Notice of Allowance for U.S. Appl. No. 12/556,562 dated Jul. 27, 2011.

USPTO Office Action for U.S. Appl. No. 12/569,337 dated May 9, 2012.

USPTO Notice of Allowance for U.S. Appl. No. 12/569,337 dated Nov. 15, 2012.

USPTO Office Action for U.S. Appl. No. 12/569,844 dated Oct. 12, 2012.

USPTO Office Action for U.S. Appl. No. 12/634,665 dated Apr. 25, 2012.

USPTO Office Action for U.S. Appl. No. 12/634,665 dated Oct. 1, 2012.

USPTO Notice of Allowance for U.S. Appl. No. 12/754,886 dated May 17, 2012.

USPTO Notice of Allowance for U.S. Appl. No. 12/754,886 dated Jun. 5, 2012.

USPTO Notice of Allowance for U.S. Appl. No. 12/754,886 dated Jun. 20, 2012.

USPTO Notice of Allowance for U.S. Appl. No. 12/785,404 dated Jul. 16, 2012.

USPTO Office Action for U.S. Appl. No. 12/891,668 dated Sep. 25, 2012.

USPTO Office Action for U.S. Appl. No. 13/025,833 dated Jul. 12, 2012.
USPTO Office Action for U.S. Appl. No. 13/041,199 dated Nov. 30, 2012.
USPTO Office Action for U.S. Appl. No. 13/175,739 dated Dec. 7, 2012.
USPTO Office Action for U.S. Appl. No. 13/179,346 dated Aug. 17, 2012.
USPTO Office Action for U.S. Appl. No. 13/179,346 dated Dec. 13, 2012.
USPTO Notice of Allowance for U.S. Appl. No. 13/425,304 dated Aug. 22, 2012.

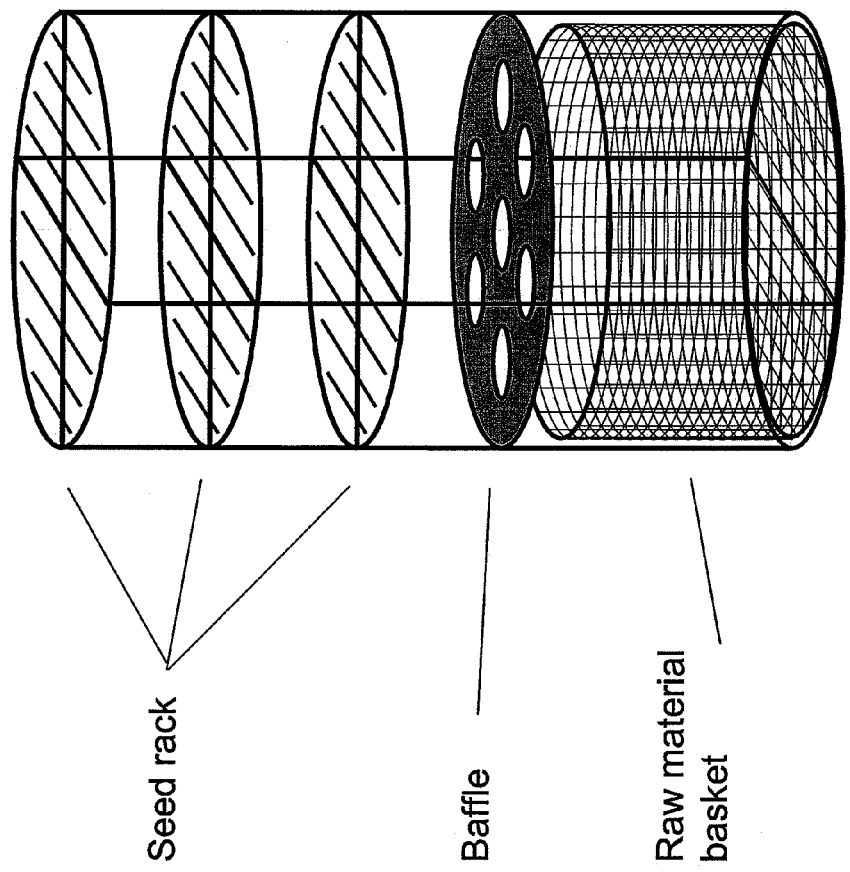
Fig. 1a – Frame

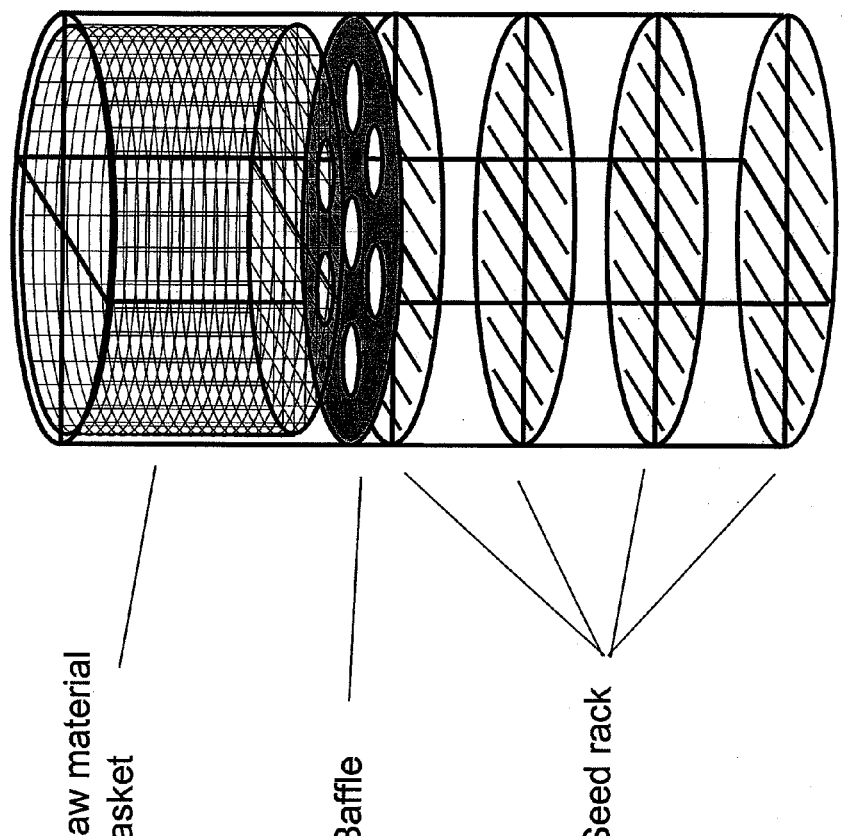
Fig. 1b – Frame
Raw material basket
Baffle
Seed rack

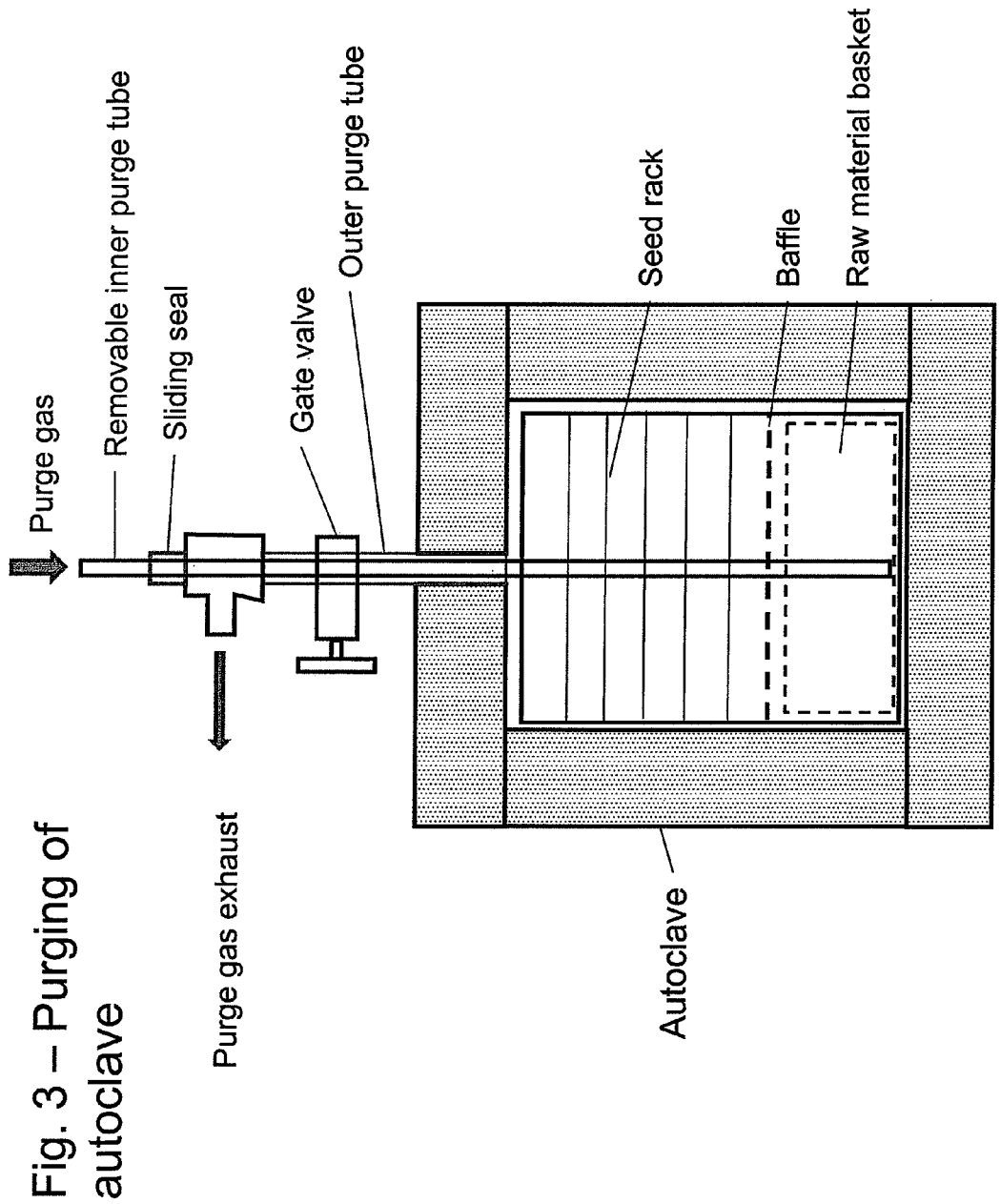
Fig. 3 – Purging of autoclave

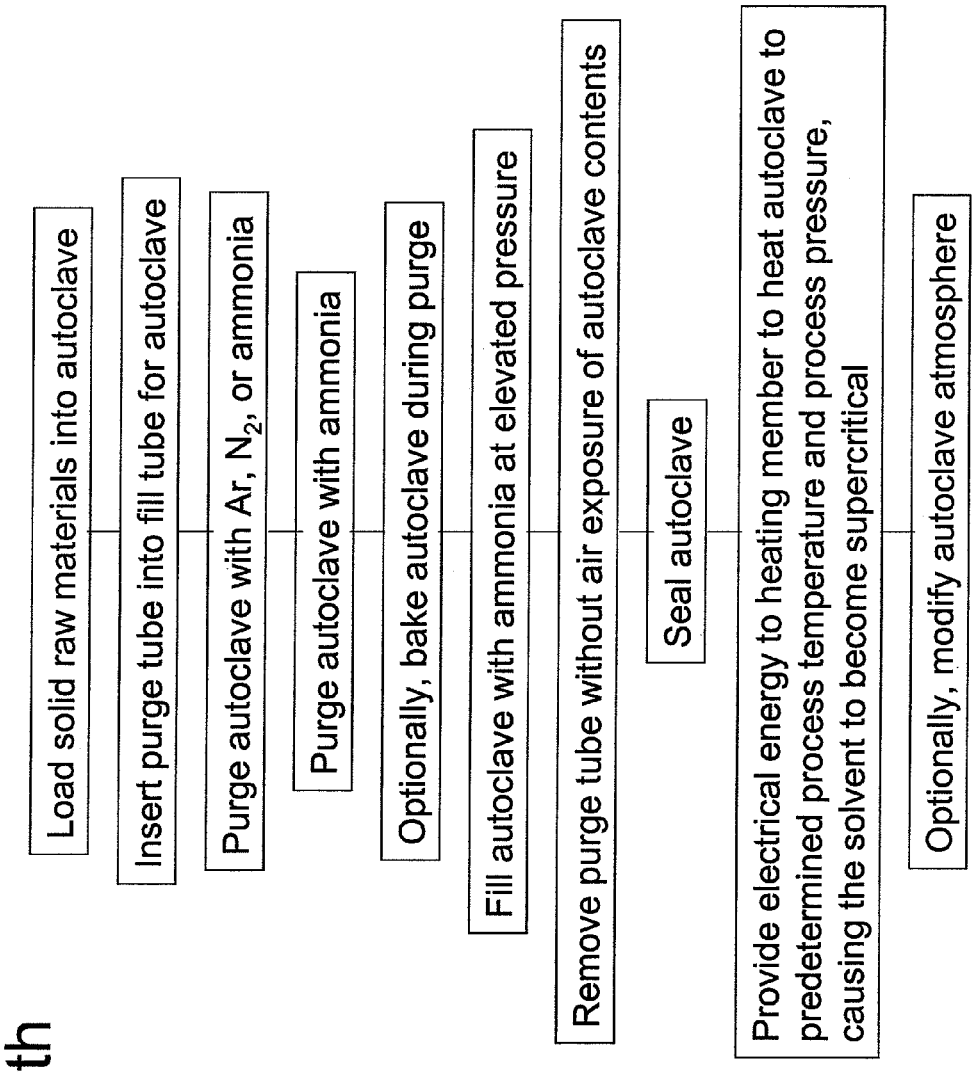
Fig. 4 – Flow diagram – purging, filling & growth

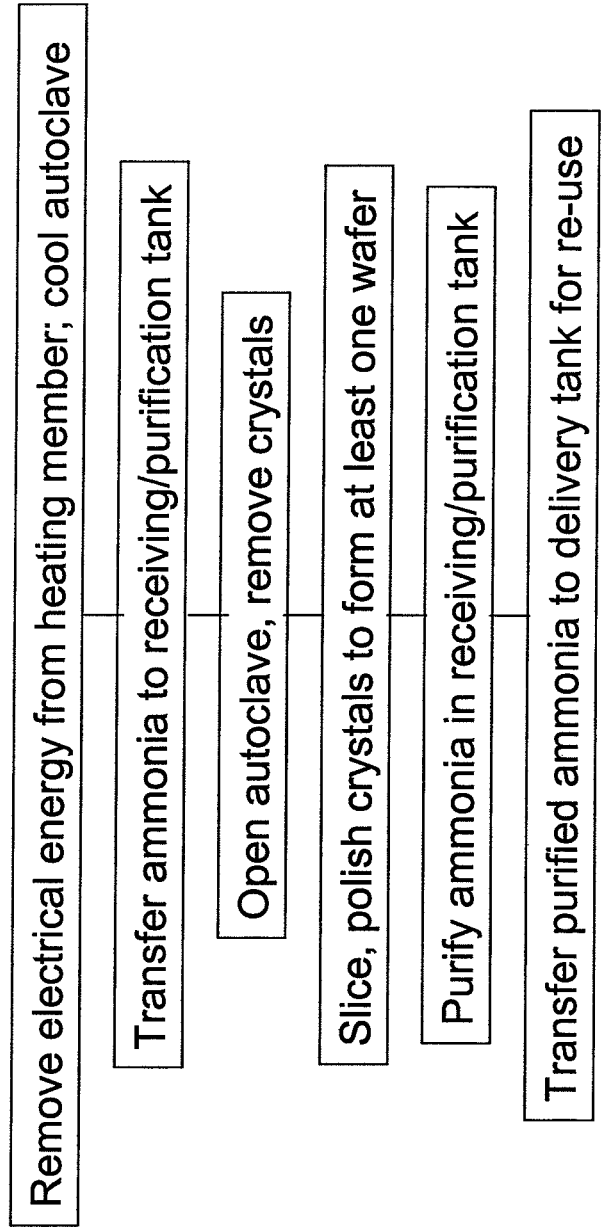
Fig. 5 – Flow diagram – Cooling & ammonia removal, recycling

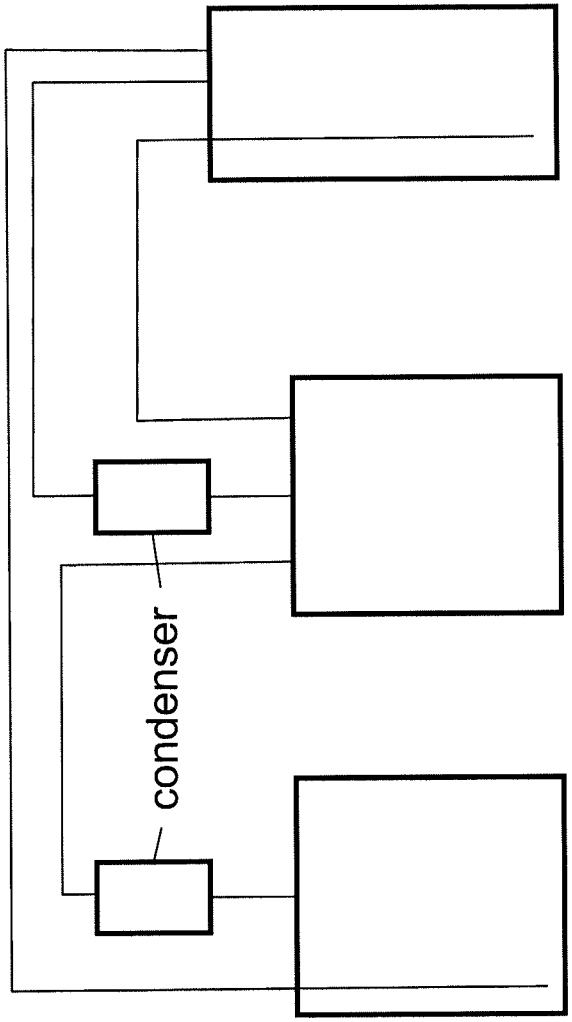
Fig. 6a – Ammonia removal & recycling
(a) single-ended autoclave or capsule

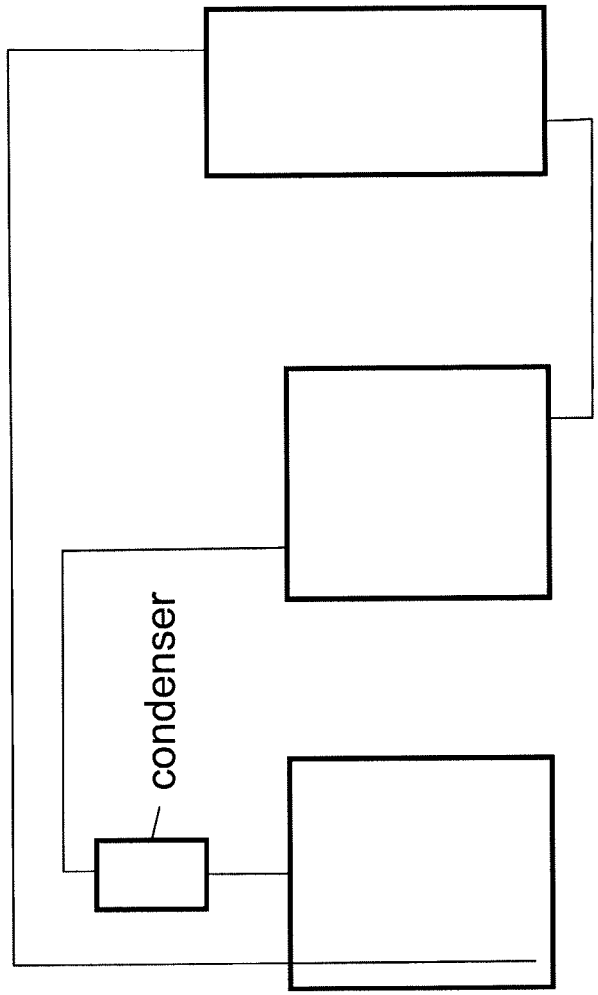
Fig. 6b – Ammonia removal & recycling
(b) double-ended autoclave or capsule

PROCESS AND APPARATUS FOR LARGE-SCALE MANUFACTURING OF BULK MONOCRYSTALLINE GALLIUM-CONTAINING NITRIDE

CROSS-REFERENCES TO RELATED APPLICATIONS

This application is a continuation application of U.S. patent application Ser. No. 12/534,857, filed on Aug. 4, 2009, which claims priority from U.S. Provisional Application 61/086,801, filed on Aug. 7, 2008, all of which are herein incorporated by reference in their entirety for all purposes.

BACKGROUND OF THE INVENTION

The present invention generally relates to processing of materials for growth of crystals. More particularly, the present invention provides a method for obtaining a gallium-containing nitride crystal by an ammonobasic technique, but there can be others. In other embodiments, the present invention provides an apparatus for large scale processing of nitride crystals, but it would be recognized that other crystals and materials can also be processed. Such crystals and materials include, but are not limited to, GaN, AlN, InN, InGaN, AlGaN, and AlInGaN, and others for manufacture of bulk or patterned substrates. Such bulk or patterned substrates can be used for a variety of applications including optoelectronic devices, lasers, light emitting diodes, solar cells, photoelectrochemical water splitting and hydrogen generation, photodetectors, integrated circuits, and transistors, among other devices.

Gallium nitride containing crystalline materials serve as a starting point for manufacture of conventional optoelectronic devices, such as blue light emitting diodes and lasers. Such optoelectronic devices have been commonly manufactured on sapphire or silicon carbide substrates that differ from the deposited nitride layers. In the conventional Metallo-Organic Chemical Vapor Deposition (MOCVD) method, deposition of GaN is performed from ammonia and organometallic compounds in the gas phase. Although successful, conventional growth rates achieved make it difficult provide a bulk layer of GaN material. Additionally, dislocation densities are also high and lead to poorer optoelectronic device performance.

Other techniques have been proposed for obtaining bulk monocrystalline gallium nitride. Such techniques include use of epitaxial deposition employing halides and hydrides in a vapor phase and is called Hydride Vapor Phase Epitaxy (HVPE) ["Growth and characterization of freestanding GaN substrates," K. Motoki et al., Journal of Crystal Growth 237-239, 912 (2002)]. Unfortunately, drawbacks exist with HVPE techniques. In some cases, the quality of the bulk monocrystalline gallium nitride is not generally sufficient for high quality laser diodes because of issues with dislocation density, stress, and the like.

Techniques using supercritical ammonia have been proposed. Peters has described the ammonothermal synthesis of aluminum nitride [J. Cryst. Growth 104, 411-418 (1990)]. R. Dwiliński et al. have shown, in particular, that it is possible to obtain a fine-crystalline gallium nitride by a synthesis from gallium and ammonia, provided that the latter contains alkali metal amides ($KNH_2$ or $LiNH_2$). These and other techniques have been described in "AMMONO method of BN, AlN, and GaN synthesis and crystal growth", Proc. EGW-3, Warsaw, Jun. 22 24, 1998, MRS Internet Journal of Nitride Semiconductor Research, http://nsr.mij.mrs.org/3/25, "Crystal growth of gallium nitride in supercritical ammonia" J. W. Kolis et al., J. Cryst. Growth 222, 431-434 (2001), and Mat. Res. Soc. Symp. Proc. Vol. 495, 367-372 (1998) by J. W. Kolis et al. However, using these supercritical ammonia processes, no wide scale production of bulk monocrystalline was achieved.

Dwiliński, in U.S. Pat. No. 7,160,388, which is hereby incorporated by reference in its entirety, generally describes an autoclave apparatus and methods for ammonothermal crystal growth of GaN. These conventional autoclave methods are useful for growth of relatively small GaN crystals but have limitations for large scale manufacturing. For example, apparatus with an inner diameter of 40 mm is somewhat useful for growing 1" diameter GaN crystals but is generally not suitable for larger scale growth of crystals. Evacuation of a conventional container, followed by chilling and flowing in gaseous ammonia, is for removing contaminants and filling with solvent at smaller reactor volumes, but may become problematic for large scale manufacturing. Although somewhat successful, drawbacks exist with these conventional ammonothermal techniques.

From the above, it is seen that improved techniques for crystal growth are highly desired.

BRIEF SUMMARY OF THE INVENTION

According to the present invention, techniques related to processing of materials for growth of crystal are provided. More particularly, the present invention provides a method for obtaining a gallium-containing nitride crystal by an ammonobasic technique, but there can be others. In other embodiments, the present invention provides an apparatus for large scale processing of nitride crystals, but it would be recognized that other crystals and materials can also be processed. Such crystals and materials include, but are not limited to, GaN, AlN, InN, InGaN, AlGaN, and AlInGaN, and others for manufacture of bulk or patterned substrates. Such bulk or patterned substrates can be used for a variety of applications including optoelectronic devices, lasers, light emitting diodes, solar cells, photoelectrochemical water splitting and hydrogen generation, photodetectors, integrated circuits, and transistors, among other devices.

In a specific embodiment, the present invention provides a bake/purge autoclave apparatus, fill with liquid $NH_3$, bleed off using $H_2$ gas with palladium (Pd) membrane. Additionally, the present invention provides a large scale high pressure ammonothermal apparatus, including seed rack, raw material basket, and baffle. Alternatively, the present invention provides a method of using an apparatus including: purging, baking during purging or evacuation, addition of liquid solvent (e.g., ammonia), removal of ammonia, recycling of ammonia, among other possible process steps.

In a specific embodiment, the present invention provides a process for growing a crystalline gallium-containing nitride. The process includes providing an autoclave comprising gallium-containing feedstock in one zone and at least one seed in another zone. The process also includes introducing a solvent capable of forming a supercritical fluid into at least the one zone and the other zone. In a preferred embodiment, the process maintains a pressure at or above about seven (7) atmospheres within the one zone and the other zone during introduction of the solvent into the one zone and the other zone. In a specific embodiment, the process includes processing one or more portions of the gallium-containing feedstock in the supercritical fluid to provide a supercritical solution comprising at least gallium containing species at a first temperature and growing crystalline gallium-containing nitride material from the supercritical solution on the seed at a second temperature, which is characterized to cause the gallium containing species to form the crystalline gallium containing nitride material on the seed.

In an alternative specific embodiment, the present invention provides a process for growing a crystalline gallium-containing nitride. The process includes providing an autoclave comprising gallium-containing feedstock in one zone and at least one seed in another zone. The process introduces a first solvent capable of forming a supercritical fluid into at least the one zone and the other zone. In a specific embodiment, the process maintains a pressure at or above about seven (7) atmospheres within the one zone and the other zone during introduction of the solvent into the one zone and the other zone. In a specific embodiment, the process also includes processing one or more portions of the gallium-containing feedstock in the supercritical fluid to provide a supercritical solution comprising at least gallium containing species at a first temperature. The process grows crystalline gallium-containing nitride material from the supercritical solution on the seed at a second temperature, which is characterized to cause the gallium containing species to form the crystalline gallium containing nitride material on the seed. In a specific embodiment, the process also includes removing thermal energy from the autoclave to form a second solvent from the supercritical solution and removing the second solvent from the autoclave through an outlet.

Still further, the present invention provides a system for growing a crystalline gallium-containing nitride. The system includes an autoclave comprising gallium-containing feedstock in a first zone and at least one seed in a second zone, and a first solvent capable of forming a supercritical fluid into at least the first zone and the second zone. A heater is coupled to the autoclave to introduce thermal energy to at least the first zone or the second zone. The system has a controller operably coupled to the heater. In a preferred embodiment, the controller is configured with one or more computer readable memories, which are provided on computer hardware, e.g., hard drive, memory integrated circuits. The one or more computer readable memories include one or more codes directed to controlling the heater to substantially maintain a pressure at or above about seven (7) atmospheres within the first zone and the second zone during a portion of process of introducing the solvent into the one zone and the other zone. Of course, there can also be other computer codes to carry out the functionality described herein and outside of the present specification.

Benefits are achieved over pre-existing techniques using the present invention. In particular, the present invention enables a cost-effective high pressure apparatus for growth of crystals such as GaN, AlN, InN, InGaN, and AlInGaN and others. In a specific embodiment, the present method and apparatus can operate with components that are relatively simple and cost effective to manufacture. Depending upon the embodiment, the present apparatus and method can be manufactured using conventional materials and/or methods according to one of ordinary skill in the art. The present apparatus and method enable cost-effective crystal growth and materials processing under extreme pressure and temperature conditions in batch volumes larger than 0.3 liters, larger than 1 liter, larger than 3 liters, larger than 10 liters, larger than 30 liters, larger than 100 liters, and larger than 300 liters according to a specific embodiment. Depending upon the embodiment, one or more of these benefits may be achieved. These and other benefits may be described throughout the present specification and more particularly below.

The present invention achieves these benefits and others in the context of known process technology. However, a further understanding of the nature and advantages of the present invention may be realized by reference to the latter portions of the specification and attached drawings.

BRIEF DESCRIPTION OF THE DRAWINGS

FIGS. 1A and 1B are simplified diagrams illustrating a basket apparatus for use in material processing for crystal growth according to an embodiment of the present invention.

FIG. 3 is a simplified diagram of an autoclave with a purge according to an embodiment of the present invention.

FIG. 4 is a simplified diagram illustrating a crystal growth method according to an embodiment of the present invention.

FIG. 5 is a simplified diagram illustrating a solvent removal and recycling method according to an embodiment of the present invention.

FIGS. 6A and 6B are simplified diagrams illustrating a solvent removal and recycle method for crystal growth according to an embodiment of the present invention.

DETAILED DESCRIPTION OF THE INVENTION

Figure 1:
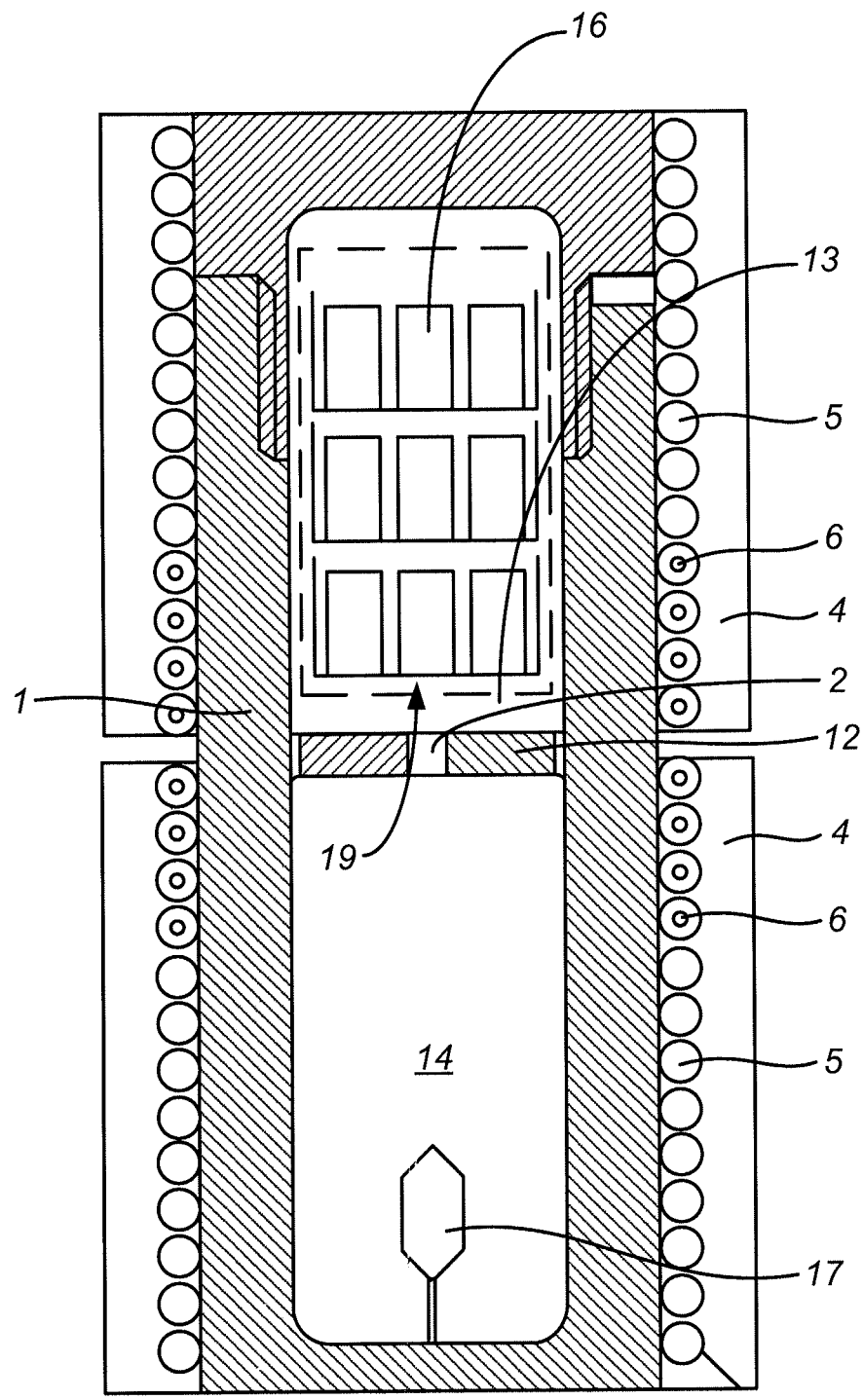
FIG. 1 is a simplified diagram of an autoclave apparatus according to an embodiment of the present invention.

According to the present invention, techniques related to processing of materials for growth of crystal are provided. More particularly, the present invention provides a method for obtaining a gallium-containing nitride crystal by an ammonobasic or ammonoacidic technique, but there can be others. In other embodiments, the present invention provides an apparatus for large scale processing of nitride crystals, but it would be recognized that other crystals and materials can also be processed. Such crystals and materials include, but are not limited to, GaN, AlN, InN, InGaN, AlGaN, and AlInGaN, and others for manufacture of bulk or patterned substrates. Such bulk or patterned substrates can be used for a variety of applications including optoelectronic devices, lasers, light emitting diodes, solar cells, photoelectrochemical water splitting and hydrogen generation, photodetectors, integrated circuits, and transistors, among other devices.

In the present invention the following definitions apply according to one or more embodiments. Such definitions are not intended to be limiting, but should be helpful to the reader.

Gallium-containing nitride means a nitride of gallium and optionally other element(s) of group XIII (according to IUPAC, 1989). It includes, but is not restricted to, the binary compound GaN, ternary compounds such as AlGaN, InGaN and also AlInGaN, where the ratio of the other elements of group XIII to Ga can vary in a wide range.

Bulk monocrystalline gallium-containing nitride means a monocrystalline substrate made of gallium-containing nitride from which optoelectronic devices such as LED or LD can be formed by epitaxial methods such as MOCVD and HVPE.

Supercritical solvent means a fluid in a supercritical state. It can also contain other components in addition to the solvent itself as long as these components do not substantially influence or disturb function of supercritical solvent. In particular, the solvent can contain ions of alkali metals. A superheated solvent, that is, a solvent heated to a temperature above its boiling point at atmospheric pressure, may also be referred to as supercritical. The latter designation may be useful in cases where the precise critical point of the solvent is not known, due, for example, to the presence of dissolved alkali ions and group III ions, molecules, or complexes.

Supercritical solution is used when referring to the supercritical solvent when it contains gallium in a soluble form originating from the etching of gallium-containing feedstock.

Etching of gallium-containing feedstock means a process (either reversible or irreversible) in which said feedstock undergoes a chemical reaction and is taken up to the supercritical solvent as gallium in a soluble form, possibly gallium-complex compounds.

Crystallization means the reverse process of etching, in which gallium in a soluble form, for example, gallium-complex compounds, undergoes a chemical reaction to form crystalline gallium-containing nitride, preferably as an epitaxial layer on a seed crystal.

Solubility means the concentration of dissolved gallium in a soluble form, for example, gallium-complex compounds, that is in chemical equilibrium with crystalline gallium-containing nitride at a given temperature, pressure, and mineralizer concentration.

Processing the feedstock means a process whereby gallium in a soluble form is prepared from the feedstock. In the case where the feedstock comprises gallium-containing nitride, processing means etching. In the case where the feedstock comprises a soluble gallium-containing compound, processing means dissolution.

Gallium-complex compounds are complex compounds, in which a gallium atom is a coordination center surrounded by ligands, such as $NH_3$ molecules or its derivatives, like $NH_2^-$, $NH^{2-}$, etc.

Negative temperature coefficient of solubility means that the solubility of the respective compound is a monotonically decreasing function of temperature if all other parameters are kept constant. Similarly, positive pressure coefficient of solubility means that, if all other parameters are kept constant, the solubility is a monotonically increasing function of pressure.

Over-saturation of supercritical solution with respect to gallium-containing nitride means that the concentration of gallium in a soluble form in said solution is higher than that in chemical equilibrium. In the case of etching of gallium-containing nitride in a closed system, such an over-saturation can be achieved by either increasing the temperature and/or decreasing the pressure.

Spontaneous crystallization means an undesired process where nucleation and growth of the gallium-containing nitride from over-saturated supercritical solution take place at any site within an autoclave except at the surface of a seed crystal where the growth is desired. Spontaneous crystallization also comprises nucleation and disoriented growth on the surface of seed crystal.

Selective crystallization on a seed means a process of crystallization on a seed carried out without spontaneous crystallization.

Autoclave means a closed container which has a reaction chamber where the ammonobasic or ammonoacidic process according to the present invention is carried out. As conventionally used in the art, closed is understood to mean sealed and gas tight in the ordinary meaning. As conventionally used in the art, an autoclave is understood to be externally heated, that is, so that the temperature of the inner walls of the autoclave is approximately equal to the temperature of the supercritical fluid proximate to the autoclave walls in the ordinary meaning.

High pressure apparatus means an apparatus capable of containing supercritical ammonia and a growth environment for gallium-containing nitride at temperatures between about 100 degrees Celsius and about 800 degrees Celsius and pressures between about 1 kilobar (kbar) and about 10 kbar. In one embodiment, the high pressure apparatus comprises an autoclave, as described by U.S. Pat. No. 7,335,262, which is hereby incorporated by reference in its entirety. In another embodiment, the high pressure apparatus is an internally heated high pressure apparatus, as described in U.S. Pat. No. 7,125,453, and in U.S. Patent Applications 2006/0177362A1 and U.S. Ser. No. 12/133,364, which are hereby incorporated by reference in their entirety.

In the discussion that follows, the apparatus is described as being vertically oriented. In another embodiment, the apparatus is instead horizontally oriented or oriented at an oblique angle intermediate between vertical and horizontal, and may be rocked so as to facilitate convection of the supercritical fluid within the high pressure apparatus.

The present invention can provide a gallium-containing nitride monocrystal having a large size and a high quality. Such gallium-containing nitride crystals can have a surface area of more than 2 $cm^2$ and a dislocation density of less than $10^6$ $cm^{-2}$. Gallium-containing nitride crystals having a thickness of at least 200 μm (preferably at least 500 μm) and a FWHM of 50 arcsec or less can also be obtained. Depending on the crystallization conditions, it possible to obtain gallium-containing nitride crystals having a volume of more than 0.05 $cm^3$, preferably more than 0.1 $cm^3$ using the processes of the invention.

As was explained above, the gallium-containing nitride crystal is a crystal of nitride of gallium and optionally other element(s) of Group XIII (the numbering of the Groups is given according to the IUPAC convention of 1989 throughout this application). These compounds can be represented by the formula $Al_xGa_{1-x-y}In_yN$, wherein $0 \leq x<1$, $0 \leq y<1$, $0 \leq x+y<1$; preferably $0 \leq x<0.5$ and $0 \leq y<0.5$. Although in a preferred embodiment, the gallium-containing nitride is gallium nitride, in a further preferred embodiment part (e.g. up to 50 mol.-%) of the gallium atoms can be replaced by one or more other elements of Group XIII (especially Al and/or In).

The gallium-containing nitride may additionally include at least one donor and/or at least one acceptor and/or at least one magnetic dopant to alter the optical, electrical and magnetic properties of the substrate. Donor dopants, acceptor dopants and magnetic dopants are well-known in the art and can be selected according to the desired properties of the substrate. Preferably the donor dopants are selected from the group consisting of Si and O. As acceptor donors Mg and Zn are preferred. Any known magnetic dopant can be included into the substrates of the present invention. A preferred magnetic dopant is Mn and possibly also Ni and Cr. The concentrations of the dopants are well-known in the art and depend on the desired end application of the nitride. Typically the concentrations of these dopants are ranging from $10^{17}$ to $10^{21}$ $cm^{-3}$.

Due to the production process the gallium-containing nitride crystal can also contain alkali elements, usually in an amount of more than about 0.1 ppm. Generally it is desired to keep the alkali elements content lower than 10 ppm, although it is difficult to specify what concentration of alkali metals in gallium-containing nitride has a disadvantageous influence on its properties.

It is also possible that halogens are present in the gallium-containing nitride. The halogens can be introduced either intentionally (as a component of the mineralizer) or unintentionally (from impurities of the mineralizer or the feedstock). It is usually desired to keep the halogen content of the gallium-containing nitride crystal in the range of about 0.1 ppm or less.

In a specific embodiment, the process of the invention is a supercritical crystallization process, which includes at least two steps: an etching step at a first temperature and at a first pressure and a crystallization step at a second temperature and at a second pressure. Since generally high pressures and/or high temperatures are involved, the process according to the invention is preferably conducted in an autoclave. The two steps (i.e. the etching step and the crystallization step) can either be conducted separately or can be conducted at least partially simultaneously in the same reactor.

For conducting the two steps separately the process can be conducted in one reactor but the etching step is conducted before the crystallization step. In this embodiment the reactor can have the conventional construction of one single chamber. The process of the invention in the two-step embodiment can be conducted using constant pressure and two different temperatures or using constant temperature and two different pressures. It is also possible to use two different pressures and two different temperatures. The exact values of pressure and temperature should be selected depending on the feedstock, the specific nitride to be crystallized and the solvent. Generally the pressure is in the range of 1 to 10 kbar, preferably 1 to 5.5 and more preferably 1.5 to 3 kbar. The temperature is in the range of 100 degrees Celsius to 800 degrees Celsius, preferably 300 degrees Celsius to 600 degrees Celsius, more preferably 400 degrees Celsius to 550 degrees Celsius. If two different pressures are employed, the difference in pressure should be from 0.1 kbar to 9 kbar, preferably from 0.2 kbar to 3 kbar. However, if the etching and crystallization are controlled by the temperature, the difference in temperature should be at least 1 degree Celsius, and preferably from 5 degrees Celsius to 150 degrees Celsius.

In a preferred embodiment, the etching step and the crystallization step are conducted at least partially simultaneously in the same container. For such an embodiment the pressure is practically uniform within the container, while the temperature difference between the etching zone and crystallization zone should be at least 1 degree Celsius, and preferably is from 5 degrees Celsius to 150 degrees Celsius. Furthermore, the temperature difference between the etching zone and the crystallization zone should be controlled so as to ensure chemical transport in the supercritical solution, which takes place through convection.

A possible construction of a preferred container is given in FIG. 1. For conciseness and ease of understanding in the following, the process will be explained particularly with respect to this preferred embodiment. However, the invention can be conducted with different container constructions as long as the principles outlined in the specification and the claims are adhered to.

In a preferred embodiment of the invention, the process can be conducted in an apparatus comprising an autoclave 1 having an internal space and comprising at least one device 4, 5, 6 for heating the autoclave to at least two zones having different temperatures, wherein the autoclave comprises a device which separates the internal space into an etching zone 13 and a crystallization zone 14. These two zones having different temperatures should preferably coincide with the etching zone 13 and the crystallization zone 14. The device which separates the internal space of the autoclave can be, for example, at least one baffle 12 having at least one opening 2. Examples are baffles having a central opening, circumferential openings or a combination thereof. The size of the opening(s) 2 should be large enough to allow transport between the zones but should be sufficiently small to maintain a temperature gradient in the reactor. The appropriate size of the opening depends on the size and the construction of the reactor and can be easily determined by a person skilled in the art.

In a specific embodiment, two different heating devices can be employed, the position of which corresponds to etching zone 13 and the crystallization zone 14. However, it has been observed that transport of gallium in a soluble form from the etching zone 13 to the crystallization zone 14 can be further improved if a third cooling means 6 is present between the first and the second heating devices and is located at approximately the position of the separating device. The cooling means 6 can be realized by liquid (e.g. water) cooling or preferably by fan cooling. The heating devices are powered electrically, by either inductive or, preferably, resistive heating means. Use of a heating 4—cooling 6—heating 5 configuration gives wider possibilities in forming the desired temperature distribution within the autoclave. For example, it enables to obtain low temperature gradients in most of the crystallization zone 14 and of the etching zone 13, and a high temperature gradient in the region of baffle 12. In a specific embodiment, the apparatus includes one or more basket devices 19 that are described in more detail below.

In a specific embodiment, the autoclave may further comprise a liner or capsule (not shown in FIG. 1). The liner or capsule may comprise a precious metal, such as at least one of silver, gold, platinum, palladium, rhodium, iridium, or ruthenium. The liner may prevent or inhibit corrosion of the walls of the autoclave and/or contamination of the growing crystals by the components of the autoclave. Examples of suitable liners or capsules are described in Japanese patent application number JP2005289797A2, U.S. Pat. No. 7,125,453, U.S. patent application Ser. No. 12/133,365, and K. Byrappa and M. Yoshimura on pages 94-96 and 152 of *Handbook of Hydrothermal Technology* (Noyes Publications, Park Ridge, N.J., 2001), each of which is hereby incorporated by reference in their entirety.

When the process of the present invention is conducted, providing a gallium-containing feedstock, an alkali metal-containing component, at least one crystallization seed and a nitrogen-containing solvent are provided in at least one container. In the preferred apparatus described above, the gallium-containing feedstock is placed in the etching zone and the at least one crystallization seed is placed in the crystallization zone. The alkali metal containing component is also preferably placed in the etching zone. Then the nitrogen-containing solvent is added into the container, which is then closed. Subsequently the nitrogen-containing solvent is brought into a supercritical state, e.g. by pressure and/or heat.

In the present invention any materials containing gallium, which can be etched or dissolved in the supercritical solvent under the conditions of the present invention, can be used as a gallium-containing feedstock. Typically the gallium-containing feedstock will be a substance or mixture of substances, which contains at least gallium, and optionally alkali metals, other Group XIII elements, nitrogen, and/or hydrogen, such as metallic Ga, alloys and inter-metallic compounds, hydrides, amides, imides, amidoimides, azides. Suitable gallium-containing feedstocks can be selected from the group consisting of gallium nitride GaN, azides such as $Ga(N_3)_3$, imides such as $Ga_2(NH)_3$, amido-imides such as $Ga(NH)NH_2$, amides such as $Ga(NH_2)_3$, hydrides such as $GaH_3$, gallium-containing alloys, metallic gallium and mixtures thereof. Preferred feedstocks are metallic gallium and gallium nitride and mixtures thereof. Most preferably, the feedstock is metallic gallium or gallium nitride. If other elements of Group XIII are to be incorporated into the gallium-containing nitride crystal, corresponding compounds or mixed compounds including Ga and the other Group XIII element can be used. If the substrate is to contain dopants or other additives, precursors thereof can be added to the feedstock.

The form of the feedstock is not particularly limited and it can be in the form of one or more pieces or in the form of a powder. If the feedstock is in the form of a powder, care should be taken that individual powder particles are not transported from the etching zone to the crystallization zone, where they can cause irregular crystallization. It is preferable that the feedstock is in one or more pieces and that the surface area of the feedstock is larger than that of the crystallization seed.

The nitrogen-containing solvent employed in the present invention should be able to form a supercritical fluid, in which gallium can be etched in the presence of alkali metal ions. Preferably the solvent is ammonia, a derivative thereof or mixtures thereof. An example of a suitable ammonia derivative is hydrazine. Most preferably the solvent is ammonia. To reduce corrosion of the reactor and to avoid side-reactions, halogens e.g. in the form of halides are preferably not intentionally added into the reactor unless a liner or capsule is present. Although traces of halogens may be introduced into the system in the form of unavoidable impurities of the starting materials, care should be taken to keep the amount of halogen as low as possible. Due to the use of a nitrogen-containing solvent such as ammonia it is not necessary to include nitride compounds into the feedstock. Metallic gallium (or aluminum or indium) can be employed as the source material while the solvent provides the nitrogen required for the nitride formation.

It has been observed that the solubility of gallium-containing feedstock, such as gallium and corresponding elements of Group XIII and/or their compounds, can be significantly improved by the presence of at least one type of alkali metal-containing component as a solubilization aid ("mineralizer"). Lithium, sodium and potassium are preferred as alkali metals, wherein sodium and potassium are more preferred. The mineralizer can be added to the supercritical solvent in elemental form or preferably in the form of its compound. Generally the choice of the mineralizer depends on the solvent employed in the process. Alkali metal having a smaller ion radius can provide lower solubility than that obtained with alkali metals having a larger ion radius. For example, if the mineralizer is in the form of a compound, it is preferably an alkali metal hydride such as MH, an alkali metal nitride such as $M_3N$, an alkali metal amide such as $MNH_2$, an alkali metal imide such as $M_2NH$ or an alkali metal azide such as $MN_3$ (wherein M is an alkali metal). The concentration of the mineralizer is not particularly restricted and is selected so as to ensure adequate levels of solubility. It is usually in the range of 1:200 to 1:2, in the terms of the mols of the metal ion based on the mols of the solvent (molar ratio). In a preferred embodiment the concentration is from 1:100 to 1:5, more preferably 1:20 to 1:8 mols of the metal ion based on the mols of the solvent.

The presence of the alkali metal in the process can lead to alkali metal elements in the thus prepared substrates. It is possible that the amount of alkali metal elements is more than about 0.1 ppm, even more than 10 ppm. However, in these amounts the alkali metals do not detrimentally effect the properties of the substrates. It has been found that even at an alkali metal content of 500 ppm, the operational parameters of the substrate according to the invention are still satisfactory.

In other embodiments, the mineralizer may comprise an ammonium halide, such as $NH_4F$, $NH_4Cl$, $NH_4Br$, or $NH_4I$, a gallium halide, such as $GaF_3$, $GaCl_3$, $GaBr_3$, $GaI_3$, or any compound that may be formed by reaction of one or more of HF, HCl, HBr, HI, Ga, and $NH_3$. The mineralizer may comprise other alkali, alkaline earth, or ammonium salts, other halides, urea, sulfur or a sulfide salt, or phosphorus or a phosphorus-containing salt. A liner or capsule may be used in conjunction with the autoclave to reduce or eliminate corrosion. The mineralizer may be provided as a metal, a loose powder, as granules, or as at least one densified compact or pill.

The dissolved gallium complexes crystallize in the crystallization step under the low solubility conditions on the crystallization seed(s) which are provided in the container. The process of the invention allows bulk growth of monocrystalline gallium-containing nitride on the crystallization seed(s) and in particular leads to the formation of stoichiometric nitride in the form of a monocrystalline bulk layer on the crystallization seed(s).

Various crystals can be used as crystallization seeds in the present invention, however, it is preferred that the chemical and crystallographic constitution of the crystallization seeds is similar to those of the desired layer of bulk monocrystalline gallium-containing nitride. Therefore, the crystallization seed preferably comprises a crystalline layer of gallium-containing nitride and optionally one or more other elements of Group XIII. To facilitate crystallization of the etched feedstock, the defects surface density of the crystallization seed is preferably less than $10^6$ $cm^{-2}$. Suitable crystallization seeds generally have a surface area of 8×8 $mm^2$ or more and thickness of 100 µm or more, and can be obtained e.g. by HVPE.

After the starting materials have been introduced into the container and the nitrogen-containing solvent has been brought into its supercritical state, the gallium-containing feedstock is at least partially etched at a first temperature and a first pressure, e.g. in the etching zone of an autoclave. Gallium-containing nitride crystallizes on the crystallization seed (e.g. in the crystallization zone of an autoclave) at a second temperature and at a second pressure while the nitrogen-containing solvent is in the supercritical state, wherein the second temperature is higher than the first temperature and/or the second pressure is lower than the first pressure, in cases of a negative temperature coefficient for solubility. In cases of a positive temperature coefficient of solubility, the second temperature may be lower than the first temperature. If the etching and the crystallization steps take place simultaneously in the same container, the second pressure is essentially equal to the first pressure.

This is possible since the solubility under some conditions of the present invention shows a negative temperature coefficient and a positive pressure coefficient in the presence of alkali metal ions. Without wishing to be bound by theory, it is postulated that the following processes occur. In the etching zone, the temperature and pressure are selected such that the gallium-containing feedstock is etched, forming soluble gallium complexes, and the nitrogen-containing solution is undersaturated with respect to gallium-containing nitride. At the crystallization zone, the temperature and pressure are selected such that the solution, although it contains approximately the same concentration of gallium complexes as in the etching zone, is over-saturated with respect to gallium-containing nitride. Therefore, crystallization of gallium-containing nitride on the crystallization seed occurs. Due to the temperature gradient, pressure gradient, concentration gradient, different chemical or physical character of dissolved gallium complexes and crystallized product etc., gallium is transported in a soluble form from the etching zone to the crystallization zone. In the present invention this is referred to as chemical transport of gallium-containing nitride in the supercritical solution. It is postulated that the soluble form of gallium is a gallium complex compound, with Ga atom in the coordination center surrounded by ligands, such as $NH_3$ molecules or its derivatives, like $NH_2^-$, $NH^{2-}$, etc.

This theory may be equally applicable for all gallium-containing nitrides, such as AlGaN, InGaN and AlInGaN as well as GaN (the mentioned formulas are only intended to give the components of the nitrides. It is not intended to indicate their relative amounts). In such cases also aluminum and/or indium in a soluble form have to be present in the supercritical solution.

In a preferred embodiment of the invention, the gallium-containing feedstock is etched in at least two steps. In this embodiment, the gallium-containing feedstock generally comprises two kinds of starting materials which differ in at least one of the kinetics or thermodynamics of etching. A difference in solubility can be achieved chemically (e.g. by selecting two different chemical compounds) or different etching kinetics can be achieved physically (e.g. by selecting two forms of the same compound having definitely different surface areas, like microcrystalline powder and big crystals). In a preferred embodiment, the gallium-containing feedstock comprises two different chemical compounds such as metallic gallium and gallium nitride which etch at different rates. In a first etching step, the first component of the gallium-containing feedstock is substantially completely etched away at an etching temperature and at an etching pressure in the etching zone. The etching temperature and the etching pressure, which can be set only in the etching zone or preferably in the whole container, are selected so that the second component of the gallium-containing feedstock and the crystallization seed(s) remain substantially unetched. This first etching step results in an undersaturated or at most saturated solution with respect to gallium-containing nitride. For example, the etching temperature can be 100 degrees Celsius to 350 degrees Celsius, preferably from 150 degrees Celsius to 300 degrees Celsius. The etching pressure can be 0.1 kbar to 5 kbar, preferably from 0.1 kbar to 3 kbar. Generally the etching temperature is lower than the first temperature.

Subsequently the conditions in the crystallization zone are set at a second temperature and at a second pressure so that over-saturation with respect to gallium-containing nitride is obtained and crystallization of gallium-containing nitride occurs on the at least one crystallization seed. Simultaneously the conditions in the etching zone are set at a first temperature and at a first pressure (practically equal to the second pressure) so that the second component of the gallium-containing feedstock is now etched (second etching step). As explained above the second temperature is higher than the first temperature (in the case of a negative temperature coefficient of solubility) and/or the second pressure is lower than the first pressure so that the crystallization can take advantage of the negative temperature coefficient of solubility and/or by means of the positive pressure coefficient of solubility. Preferably the first temperature is also higher than the etching temperature. During the second etching step and the crystallization step, the system should be in a stationary state so that the concentration of gallium in the supercritical solution remains substantially constant, i.e. the same amount of gallium should be etched per unit of time as is crystallized in the same unit of time. This allows for the growth of gallium-containing nitride crystals of especially high quality and large size.

Typical pressures for the crystallization step and the second etching step are in the range of 1 to 10 kbar, preferably 1 to 5.5 and more preferably 1.5 to 3 kbar. The temperature is in the range of 100 to 800 degrees Celsius, preferably 300 to 600 degrees Celsius, more preferably 400 to 550 degrees Celsius. The difference in temperature should be at least 1 degrees Celsius, and preferably from 5 degrees Celsius to 150 degrees Celsius. As explained above, the temperature difference between the etching zone and crystallization zone should be controlled so as to ensure a chemical transport in the supercritical solution, which takes place through convection in an autoclave.

In the process of the invention, the crystallization should take place selectively on the crystallization seed and not on a wall of the container. Therefore, the over-saturation extent with respect to the gallium-containing nitride in the supercritical solution in the crystallization zone should be controlled so as to be below the spontaneous crystallization level where crystallization takes place on a wall of the autoclave as well as on the seed, i.e. the level at which spontaneous crystallization occurs. This can be achieved by adjusting the chemical transport rate and the crystallization temperature and/or pressure. The chemical transport is related on the speed of a convection flow from the etching zone to the crystallization zone, which can be controlled by the temperature difference between the etching zone and the crystallization zone, the size of the opening(s) of baffle(s) between the etching zone and the crystallization zone and so on.

In a specific embodiment, feedstock material can also be prepared using a method similar to those described above. The method involves:

1. providing a gallium-containing feedstock, an alkali metal-containing component, at least one crystallization seed and a nitrogen-containing solvent in a container having at least one zone and a basket structure;
2. subsequently bringing the nitrogen-containing solvent into a supercritical state;
3. subsequently etching the gallium-containing feedstock (such as metallic gallium or aluminum or indium, preferably metallic gallium) at an etching temperature and at an etching pressure, whereby the gallium-containing feedstock is substantially completely etched away and the crystallization seed remains substantially unetched so that an undersaturated solution with respect to gallium-containing nitride is obtained; and
4. subsequently setting the conditions in the container at a second temperature and at a second pressure so that over-saturation with respect to gallium-containing nitride is obtained and crystallization of gallium-containing nitride occurs on the at least one crystallization seed.
5. perform other steps, as desired.

The conditions described above with respect to the etching temperature and the second temperature also apply in this embodiment.

Figure 2:
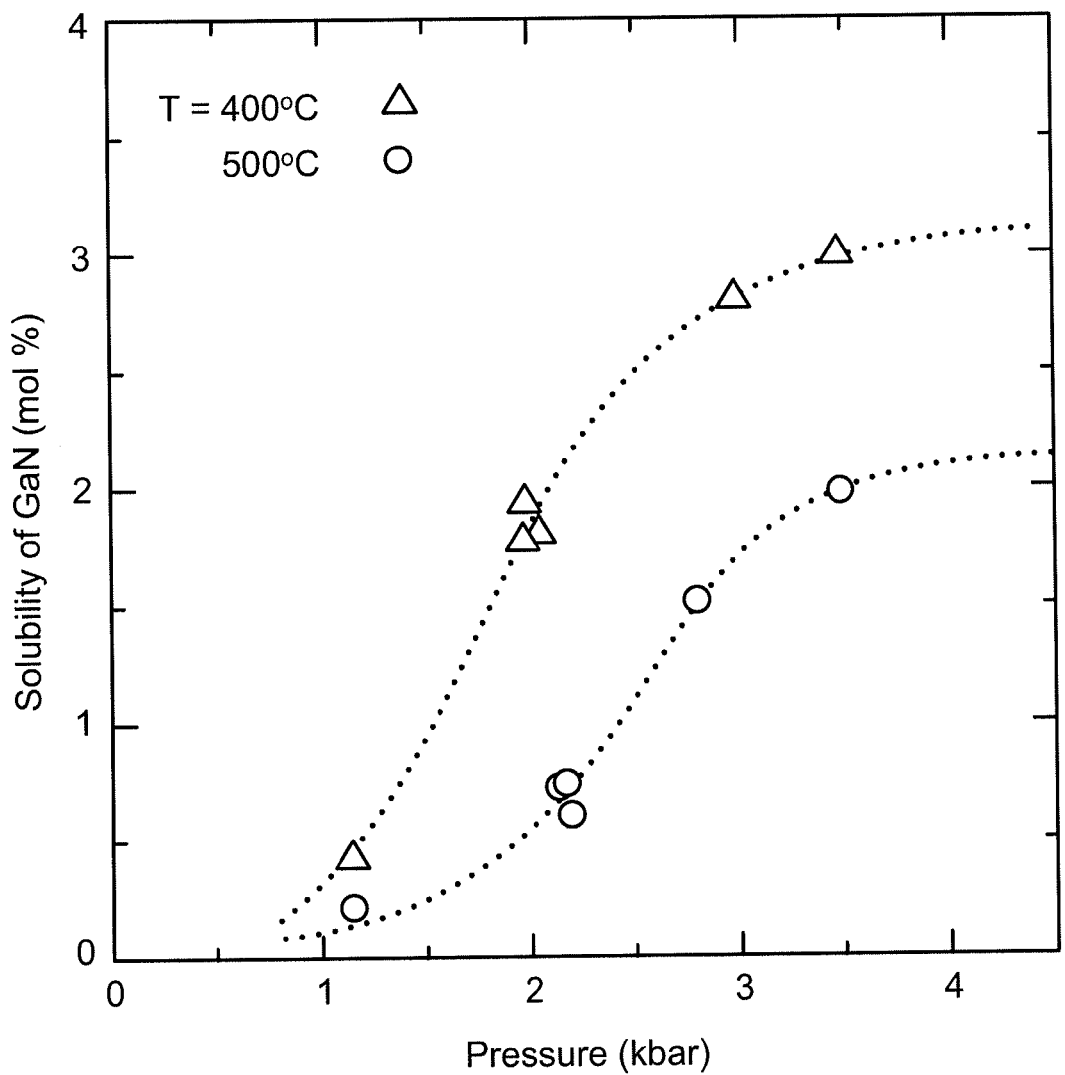
FIG. 2 is a simplified diagram illustrating solubility of GaN plotted against pressure according to an embodiment of the present invention.

Gallium-containing nitride exhibits good apparent solubility in supercritical nitrogen-containing solvents (e.g. ammonia), provided alkali metals or their compounds, such as $KNH_2$, are introduced into it. FIG. 2 shows the solubility of gallium-containing nitride in a supercritical solvent versus pressure for temperatures of 400 and 500 degrees Celsius wherein the solubility is defined by the molar percentage: $S_m \equiv GaN^{solvent}:(KNH_2+NH_3)$ 100%. In the presented case the solvent is the $KNH_2$ solution in supercritical ammonia of a molar ratio $x \equiv KNH_2:NH_3$ equal to 0.07. For this case $S_m$ should be a smooth function of only three parameters: temperature, pressure, and molar ratio of mineralizer (i.e. $S_m = S_m(T, p, x)$). Small changes of $S_m$ can be expressed as: $\Delta S_m \approx (\partial S_m/\partial T)|_{p,x}\Delta T + (\partial S_m/\partial p)|_{T,x}\Delta p + (\partial S_m/\partial x)|_{T,p}\Delta x$, where the partial differentials (e.g. $(\partial S_m/\partial T)|_{p,x}$) determine the behavior of $S_m$ with variation of its parameters (e.g. T). In this specification the partial differentials are called "coefficients" (e.g. $(\partial S_m/\partial T)|_{p,x}$ is a "temperature coefficient of solubility").

The diagram shown illustrates that the solubility increases with pressure and decreases with temperature in the presence of alkali-containing mineralizer, which means that it possesses a negative temperature coefficient and a positive pressure coefficient. Such features allow obtaining a bulk monocrystalline gallium-containing nitride by etching in the higher solubility conditions, and crystallization in the lower solubility conditions. In particular, the negative temperature coefficient means that, in the presence of temperature gradient, the chemical transport of gallium in a soluble form can take place from the etching zone having a lower temperature to the crystallization zone having a higher temperature.

The process according to invention allows the growth of bulk monocrystalline gallium-containing nitride on the seed and leads in particular to creation of stoichiometric gallium nitride, obtained in the form of monocrystalline bulk layer grown on a gallium-nitride seed. Since such a monocrystal is obtained in a supercritical solution that contains ions of alkali metals, it contains also alkali metals in a quantity higher than 0.1 ppm. Because it is desired to maintain a purely basic character of a supercritical solution, mainly in order to avoid corrosion of the apparatus, halides are preferably not intentionally introduced into the solvent. The process of the invention can also provide a bulk monocrystalline gallium nitride in which part of the gallium, e.g. from 0.05 to 0.5 may be substituted by Al and/or In. Moreover, the bulk monocrystalline gallium nitride may be doped with donor and/or acceptor and/or magnetic dopants. These dopants can modify optical, electric and magnetic properties of a gallium-containing nitride. With respect to the other physical properties, the bulk monocrystalline gallium nitride can have a dislocation density below $10^6$ cm$^{-2}$, preferably below $10^5$ cm$^{-2}$, or most preferably below $10^4$ cm$^{-2}$. Besides, the FWHM of the X-ray rocking curve from (0002) plane can be below 600 arcsec, preferably below 300 arcsec, and most preferably below 60 arcsec. The best bulk monocrystalline gallium nitride obtained may have a dislocation density lower than $10^4$ cm$^{-2}$ and simultaneously a FWHM of X-ray rocking curve from (0002) plane below 60 arcsec.

Due to the good crystalline quality of the obtained gallium-containing nitride crystals obtained in the present invention, they may be used as a substrate material for optoelectronic semiconductor devices based on nitrides, in particular for laser diodes and light emitting diodes.

In a specific embodiment, a schematic of a frame for seed crystals and raw material is shown in by FIGS. 1A and 1B. The frame enables seed crystals and raw material to be loaded into a suitable configuration for crystal growth prior to placement inside the high pressure apparatus and in a form that is convenient for subsequent handling. The frame should retain good rigidity under crystal growth conditions and be chemically inert to the crystal growth environment, neither contributing contamination to the growing crystals nor undergoing significant corrosion. The materials of construction of the frame and the components thereof may include one or more of copper, copper-based alloy, gold, gold-based alloy, silver, silver-based alloy, palladium, platinum, iridium, ruthenium, rhodium, osmium, titanium, vanadium, chromium, iron, iron-based alloy, nickel, nickel-based alloy, zirconium, niobium, molybdenum, tantalum, tungsten, rhenium, silica, alumina, combinations thereof, and the like. Iron-base alloys that may be used to form the frame include, but are not limited to, stainless steels. Nickel-base alloys that may be used to form the frame include, but are not limited to, inconel, hastelloy, and the like. Again, there can be other variations, modifications, and alternatives. In some embodiments, the components of the frame are fabricated from an alloy comprising at least two elements, for increased hardness and creep resistance. The frame and its components may comprise wire, wire cloth or mesh, foil, plate, sheet, square bar, round bar, rectangular bar, tubing, threaded rod, and fasteners. The frame and its components may be attached by means of welding, arc welding, resistance welding, brazing, clamping, attachment by means of fasteners such as at least one of screws, bolts, threaded rod, and nuts, and the like.

The frame may include, as components, a baffle, a raw material basket, and a rack for suspending seed crystals, plus a means for attaching at least two of the aforementioned components. In one set of embodiments, illustrated in FIG. 1A, appropriate for the case where the crystal to be grown has a solubility that increases with increasing temperature (i.e., a positive temperature coefficient of solubility), the basket is positioned below the baffle and the seed rack is positioned above the baffle. In another set of embodiments, illustrated in FIG. 1B, appropriate for the case where the crystal to be grown has a solubility that decreases with increasing temperature, i.e., retrograde solubility or a negative temperature coefficient of solubility, the basket is positioned above the baffle and the seed rack is positioned below the baffle. Growth of gallium nitride crystals under ammonobasic conditions normally falls in this category. A larger volume may be provided for the crystal growing region, that is, the region containing the seed rack, than for the nutrient region, that is, the region containing the basket. In one specific embodiment, the ratio of the volumes of the crystal growing region and the nutrient region is between 1 and 5. In other embodiments, this ratio is between 1.25 and 3, or between 1.5 and 2.5. The overall diameter and height of the frame are chosen for a close fit within the high pressure apparatus, so as to maximize the utilization of the available volume and optimize the fluid dynamics. The diameter of the frame may be between 1 inch and 2 inches, between 2 inches and 3 inches, between 3 inches and 4 inches, between 4 inches and 6 inches, between 6 inches and 8 inches, between 8 inches and 10 inches, between 10 inches and 12 inches, between 12 inches and 16 inches, between 16 inches and 24 inches, or greater than 24 inches. The ratio of the overall height of the frame to its diameter may be between 1 and 2, between 2 and 4, between 4 and 6, between 6 and 8, between 8 and 10, between 10 and 12, between 12 and 15, between 15 and 20, or greater than 20.

The baffle provides a means for dividing the high pressure apparatus into which the frame is to be inserted into two separate regions, and comprises one or more disks. The two regions are in fluid communication with each other, as baffle has a plurality of through-holes, or openings. Thus, a fraction of the cross-sectional area of the baffle is open. In a specific embodiment, baffle has a fractional open area of between about 0.5% and about 30%, but can also have other percentages. In other embodiments, the baffle has a fraction open area between 2% and 20%, or between 5% and 15%. Baffle serves the purpose of confining the at least one (or more) raw material to a specific region or end of chamber while permitting solvent and, under high pressure high temperature (HPHT) conditions, supercritical fluid, to migrate throughout the high pressure apparatus by passing freely through through-holes in baffle. Often times, this feature is particularly useful in applications such as crystal growth, in which the supercritical fluid transports the at least one material, a nutrient material, from one region of the chamber, defined by placement of baffle, to another region where crystal growth on seed crystals take place. In one specific embodiment, the diameter of the baffle is equal to the maximum diameter of the overall frame. In other embodiments, the diameter of the baffle is slightly less than the maximum diameter of the overall frame, providing an annular space through which fluid can flow under crystal growth conditions. The diameter of the baffle may be less than the maximum diameter of the overall frame by 0.5 inch or less. The openings in the baffle should be large enough so as not to clog readily. In one specific embodiment, the diameters of the openings in the baffle are between 0.020 inch and 0.5 inch. In another embodiment, the diameters of the openings in the baffle are between 0.050 inch and 0.25 inch. In one specific embodiment, the baffle comprises a single disk with a thickness between 0.020 inch and 0.5 inch. In another embodiment, the baffle comprises a single disk with a thickness between 0.050 inch and 0.25 inch. In some embodiments, the baffle comprises two disks, three disks, or more. In some multi-disk embodiments one or more of the openings in the disks lie above one another. In other multi-disk embodiments, one or more of the openings in the disks do not lie above one another. The effective fractional open area in multi-disk baffle embodiments may therefore lie between the fractional open area of each disk, as an upper bound, and the product of the fractional open areas of each disk.

The raw material basket provides a convenient means for transferring the raw material into the high pressure apparatus, for permitting facile fluid communication from the region between raw material particles within the basket and the crystal growth region, and for removing un-consumed raw material from the reactor at the conclusion of a growth run. In one embodiment, the basket comprises wire mesh or wire cloth, as indicated schematically in the figures. The diameter of the wire in the mesh or cloth may be between 0.001 inch and 0.25 inch, between 0.005 inch and 0.125 inch, or between 0.010 inch and 0.080 inch. The wire mesh or wire cloth may be contained within and, optionally, attached to a frame comprising larger-diameter wire so as to provide improved mechanical support. In another embodiment, the basket comprises foil or plate with a plurality of through-holes or openings. The size of the openings in the wire mesh, wire cloth, or foil or plate should be small enough so that raw material particles do not pass through them during crystal growth, even after a significant portion of the raw material has been etched away and/or consumed by the crystal growth operation. In one specific embodiment, the openings in the wire mesh, wire cloth, or foil or plate have a diameter between 0.005 inch and 0.5 inch. In other embodiments, the openings have a diameter between 0.010 inch and 0.125 inch, or between 0.025 inch and 0.080 inch. In some embodiments, hollow pipes, with openings that are covered by wire mesh, are placed within the basket prior to loading of the raw material so as to improve fluid communication between the region between raw material particles within the basket and the crystal growth region. Suitable configurations for such hollow pipes are described by U.S. Pat. No. 3,245,760, which is hereby incorporated by reference in its entirety, according to a specific embodiment.

In some embodiments, the raw material is placed in the basket prior to placement of seed crystals on the seed rack, so as to minimize the likelihood of breakage of the latter. The raw material may be supplied in various forms. In some embodiments, the raw material comprises single crystals or chunks or grit of polycrystalline material. In other embodiments, the raw material comprises chunks of sintered polycrystalline material. In the case of gallium nitride, the raw material may be derived from by-product single- or polycrystalline GaN deposited on the wall or miscellaneous surfaces with a hydride vapor phase epitaxy (HVPE) reactor. In another specific embodiment, the raw material comprises plates of single- or poly-crystalline GaN grown on a substrate by HVPE. In another specific embodiment, the raw material is derived from sintered GaN powder, as described by U.S. Pat. No. 6,861,130, which is hereby incorporated by reference in its entirety. In another specific embodiment, the raw material is derived from polycrystalline GaN plates comprising a columnar microstructure, as described by U.S. Patent Application 2007/0142204A1, which is hereby incorporated by reference in its entirety. The raw material may contain oxygen at a concentration below $10^{19}$ cm$^{-3}$, below $10^{18}$ cm$^{-3}$, or below $10^{17}$ cm$^{-3}$. The raw material may contain an n-type dopant, such as Si or O, a p-type dopant, such as Mg or Zn, a compensatory dopant, such as Fe or Co, or a magnetic dopant, such as Fe, Ni, Co, or Mn, at concentrations between $10^{16}$ cm$^{-3}$ and $10^{21}$ cm$^{-3}$. In one specific embodiment, the particle size distribution of the raw material lies between about 0.020 inch and about 5 inches. In another embodiment, the particle size distribution of the raw material lies between about 0.050 inch and about 0.5 inch. In a preferred embodiment, the total surface area of the raw material is greater, by at least a factor of three, than the total surface area of all the seed crystals that are placed in the seed rack.

In some embodiments, the raw material comprises a metal that will become molten at elevated temperatures, for example, gallium, indium, sodium, potassium, or lithium. If placed in direct contact with the inner surface of the autoclave or capsule the metal may form an alloy, compromising the integrity of the autoclave or capsule. In some embodiments, therefore, at least one crucible containing at least one metal is placed within or proximate to the raw material basket. The crucible should be chemically inert with respect to the supercritical fluid crystal growth environment and should not react or alloy with the at least one metal. In one specific embodiment, the crucible comprises molybdenum, tantalum, niobium, iridium, platinum, palladium, gold, silver, or tungsten. In another specific embodiment, the crucible comprises alumina, magnesia, calcia, zirconia, yttria, aluminum nitride or gallium nitride. The crucible may comprise a sintered or other polycrystalline material.

In a preferred embodiment, the seed rack provides a convenient means for transferring the seed crystals or plates into the high pressure apparatus, for permitting facile fluid communication between the seed crystals or plates and the nutrient region on the other side of the baffle, and for removing the grown crystals from the reactor at the conclusion of a growth run. The seed rack should be easy to load and unload, enable efficient usage of the available crystal growth volume, and minimize breakage and other yield losses of the crystals.

In preferred embodiments, the seed crystals or plates comprise gallium nitride. In other embodiments, the seed crystals or plates may comprise aluminum nitride, sapphire, silicon carbide, $MgAl_2O_4$ spinel, zinc oxide, or the like.

In some embodiments, the frame further comprises a set of stacked disks or baffles on the top end of the frame. The stacked disks or baffles reduce convective heat transfer from the supercritical fluid during crystal growth to the upper end of the autoclave so that the seal of the autoclave may be at a reduced temperature relative to the upper end of the interior of the autoclave. In other embodiments, one or more disks or baffles are placed on top of the frame after insertion of the latter into a high pressure apparatus.

After loading the frame with seed crystals and raw material, the frame is placed inside a high pressure apparatus or in a liner or capsule which is then placed inside a high pressure apparatus. At least one mineralizer may be added. The mineralizer may comprise an alkali metal such as Li, Na, K, Rb, or Cs, an alkaline earth metal, such as Mg, Ca, Sr, or Ba, or an alkali or alkaline earth hydride, amide, imide, amido-imide, nitride, or azide. The mineralizer may comprise other alkali, alkaline earth, or ammonium salts, urea, sulfur or a sulfide salt, or phosphorus or a phosphorus-containing salt. The mineralizer may be provided as a loose powder, as granules, or as at least one densified compact or pill. The mineralizer may be added to the raw material basket, may be placed in a crucible, or may be placed directly in the high pressure apparatus or capsule. In a preferred embodiment, the mineralizer is added to the high pressure apparatus or capsule in the absence of exposure to air, such as inside a glove box.

A getter may also be added to the reaction mix. The getter preferentially reacts with residual or adventitious oxygen or moisture present, improving the purity and transparency of the grown GaN crystals. The getter may comprise at least one of an alkaline earth metal, Sc, Ti, V, Cr, Y, Zr, Nb, Hf, Ta, W, a rare earth metal, and their nitrides, amides, imides, amido-imides, or halides.

In some embodiments, at least one of the mineralizer and the getter are placed in crucibles within or proximate to the raw material basket.

The use of metallic precursors for the raw material, mineralizer, and/or getter is convenient in some respects. For example, the metal is typically available commercially in high purity, and no further synthesis is required. However, in addition to the complexity of suitably supporting a metal that melts under reaction conditions (e.g., Ga, Na, K), the use of a pure metal may generate undesirable gases, such as hydrogen. For example, under ammonthermal reaction conditions the metals listed below will undergo one or more of the following reactions:

$$Ga+NH_3=GaN+3/2H_2$$

$$Na+NH_3=NaNH_2+\tfrac{1}{2}H_2$$

$$K+NH_3=KNH_2+\tfrac{1}{2}H_2$$

$$Mg+2NH_3=Mg(NH_2)_2+H_2$$

$$3Mg+2NH_3=Mg_3N_2+3H_2$$

$$Y+3NH_3=Y(NH_2)_3+3/2H_2$$

$$Y+NH_3=YN+3/2H_2$$

The presence of hydrogen in the supercritical fluid solvent may decrease the solubility of gallium-containing species and, further, may embrittle the metal constituting the autoclave walls.

The use of azides as mineralizers is convenient in that they are often available commercially in high purity, can be purified further, and are considerably less hygroscopic than the alkali metals or amides or the alkaline earth nitrides, for example. Use of azide mineralizers is suggested by Dwiliński in U.S. Pat. No. 7,364,619, which is hereby incorporated by reference in its entirety. However, azides typically decompose under reaction conditions, generating undesirable gases, such as nitrogen:

$$3NaN_3+2NH_3=3NaNH_2+4N_2$$

In a preferred embodiment, these two effects are combined so as to cancel each other out. Metals, including raw materials, mineralizers, and getters, are added together with azide mineralizer precursors such that $H_2$ and $N_2$ are generated in approximately a 3:1 ratio. The reaction container further comprises means for catalyzing $NH_3$ formation from $H_2$ and $N_2$. Catalysis of the reaction between $H_2$ and $N_2$ liberated in the reaction of the metal with ammonia and decomposition of the azide, respectively, to re-form ammonia may be performed by the autoclave walls or by added catalyst. The added catalyst may comprise powder, granules, foil, a coating, bulk material, or a porous pellet. The added catalyst may comprise at least one of iron, cobalt, nickel, titanium, molybdenum, tungsten, aluminum, potassium, cesium, calcium, magnesium, barium, zirconium, osmium, uranium or a lanthanide, ruthenium, platinum, palladium, or rhodium. For example, a mole of added $NaN_3$ will generate 4/3 mole of $N_2$. The latter can be counterbalanced by also adding 8/3 moles of Ga metal, which will generate $8/3 \times 3/2$ mole=4 moles of $H_2$, viz., three times the number of moles of $N_2$ from $NaN_3$.

The high pressure apparatus is then closed and sealed except for a connection to a gas, liquid, or vacuum manifold. In one embodiment, the high pressure apparatus comprises an autoclave, as described by U.S. Pat. No. 7,335,262, which is hereby incorporated by reference in its entirety. The inner diameter of the autoclave may be between 1 inch and 2 inches, between 2 inches and 3 inches, between 3 inches and 4 inches, between 4 inches and 6 inches, between 6 inches and 8 inches, between 8 inches, and 10 inches, between 10 inches and 12 inches, between 12 inches and 16 inches, between 16 inches and 24 inches, or greater than 24 inches. The clearance between the inner diameter of the autoclave and the outer diameter of the frame may be between 0.005 inch and 1 inch, or between 0.010 inch and 0.25 inch. The ratio of the inner height of the autoclave to its inner diameter may be between 1 and 2, between 2 and 4, between 4 and 6, between 6 and 8, between 8 and 10, between 10 and 12, between 12 and 15, between 15 and 20, or greater than 20. Of course, there can be other variations, modifications, and alternatives.

In some embodiments, the high pressure apparatus is evacuated, so as to remove air, moisture, and other volatile contaminants. In some embodiments, the high pressure apparatus is heated during evacuation, to a temperature between about 25 degrees Celsius and about 500 degrees Celsius. In some embodiments, the high pressure heater apparatus is heated using the same heating elements that are used during high pressure processing. In some embodiments the high pressure apparatus is subjected to at least two cycles of evacuation followed by back-filling with an inert gas such as argon or nitrogen.

A limitation of evacuation as a means for removing air, moisture, and other volatile components from the autoclave is the rather limited conductance of the vacuum connection, which may require long or very long evacuation times. In the molecular flow regime, the conductance of a long tube is proportional to the diameter cubed divided by the length. For an autoclave, for example, the inner diameter of the vacuum connection might be about 2 millimeters over a length of about 50 millimeters. For air, such a connection will have a conductance of approximately 0.02 liters per second. For a large autoclave, for example, with a volume of 100 liters, the corresponding time constant for evacuation will be approximately 5000 seconds (1.4 hour). For noncondensible gases, the pressure will decay by a factor of e (2.718) during each time constant. Removal of 99.999% of the starting gases requires approximately 11.5 time constants, or 16 hours in this example. Removal of noncondensible gases, such as water vapor, can take even longer, due to adsorption of water on the walls of the apparatus and, especially, on high surface area material inside the autoclave, such as porous polycrystalline GaN raw material. Removal of condensable gases from the autoclave can be accelerated by heating during evacuation. In one specific embodiment, the autoclave is heated to a temperature between about 25 degrees Celsius and about 500 degrees Celsius while being evacuated.

In another set of embodiments, the high pressure apparatus containing the filled frame is purged to remove air, moisture, and other volatile contaminants, as shown in FIG. 3. In a specific embodiment, a method of processing materials in a high pressure apparatus is shown by FIGS. 4 and 5, which are provided for referencing purposes to describe the processes herein. Purging may provide for superior removal of air, moisture, and other volatile contaminants, relative to evacuation, because of the limited conductance through a tube or long hole to the interior of the autoclave or capsule. The efficiency of purging may be enhanced by causing purge gas to flow from one end of the interior volume of the autoclave to the other. The autoclave is coupled to a gas source by means of at least one fill tube or purge tube, preferably without exposing the contents of the autoclave to air according to a specific embodiment. The gas source may comprise at least one of nitrogen, argon, hydrogen, helium, and solvent vapor, among others. In an embodiment, both a first fill or purge tube and a second fill or purge tube are coupled to a gas source and/or exhaust. In one specific embodiment, the autoclave comprises a double-ended autoclave, with plugs at each end and purge connections on each plug.

In another embodiment, shown in FIG. 3, an inner purge tube is placed inside the fill or outer purge tube and positioned so that one end is proximate to the bottom end of the autoclave. The inner purge tube and outer purge tube may be fabricated from at least one of copper, copper-based alloy, gold, gold-based alloy, silver, silver-based alloy, palladium, platinum, iridium, ruthenium, rhodium, osmium, iron, iron-based alloy, nickel, nickel-based alloy, molybdenum, and combinations thereof. Iron-base alloys that may be used to form the inner purge tube or outer purge tube include, but are not limited to, stainless steels. Nickel-base alloys that may be used to form the inner purge tube or outer purge tube include, but are not limited to, inconel, hastelloy, and the like. The outer diameter of the inner purge tube may be less than the inner diameter of the fill or outer purge tube by at least 0.010 inch, as shown. The inner purge tube may be coupled to the fill or outer purge tube by means of a tee fitting or other suitable technique, so that purge gas introduced through the inner purge tube will exit near the bottom end of the autoclave or capsule, pass through the length of the autoclave before exhausting though the annular space in the fill or outer purge tube outside the inner purge tube and the tee fitting, providing for efficient removal of gas phase contaminants according to a specific embodiment. The interface between the tee fitting and the inner purge tube may be a sliding seal, for example, an O-ring or a differentially-pumped set of Teflon seals or O-rings. The rate of flow of the purge gas may be in the range between 0.05 and 10 standard liters per minute. The autoclave may be heated, for example, to a temperature between 25 degrees Celsius and 500 degrees Celsius during the purge operation, in order to more efficiently remove water and other adsorbed contaminants. After shutting off flow of the purge gas, solvent vapor, for example, gas phase ammonia, may be flowed through the autoclave or capsule in order to remove most or all of the purge gas.

In a specific embodiment, the inlet of the gas flow, for example, the second fill tube or the purge tube (cf. FIG. 3) is then coupled to a source of liquid solvent. The autoclave and fill tube(s) may be cooled, or the liquid solvent delivery system and transfer lines heated, so that the former are cooler by between one and 50 degrees Celsius than the latter. Liquid solvent is then introduced into the autoclave at a rate between 0.1 and 1000 grams per minute. At room temperature, the vapor pressure of ammonia is approximately 10 atmospheres. Depending on the temperature of the solvent source, therefore, the system pressure during solvent delivery may be above 7 atmospheres, above 8 atmospheres, above 9 atmospheres, or above 10 atmospheres. In one embodiment, the purge exhaust is closed and the solvent vapor above the liquid is forced to condense into liquid during the filling operation.

In this embodiment, the autoclave may be actively cooled in order to dissipate the heat released by condensation of the solvent vapor. In another embodiment, the purge exhaust is fitted with a check valve so that residual purge gas or solvent vapor is allowed to exit when the pressure exceeds a predetermined threshold, but air or other gases are not allowed to flow backward into the autoclave. The quantity of solvent in the autoclave may be determined by using a liquid delivery system with the capability for accurately monitoring and controlling the mass of liquid delivered. An example of suitable equipment for delivery of precision-metered, high-purity liquid ammonia is the InScale™ system manufactured by iCon Dynamics, LLC. In some embodiments, the amount of ammonia delivered to the autoclave is quantified by the loss in weight of at least one ammonia supply cylinder. If solvent gas is allowed to exhaust during liquid filling, in the case where ammonia is the solvent, the quantity of vented solvent may be determined by trapping it in aqueous solution and measuring the change in pH and this quantity subtracted from the total liquid delivered to determine the quantity of liquid in the capsule. An analogous method for determining the quantity of vented solvent may be performed in cases where the solvent is different from ammonia.

In an alternative embodiment, the solvent is delivered to the autoclave as a vapor at elevated pressure. The inlet of the gas flow, for example, the second fill tube or the purge tube (cf. FIG. 3) is then coupled to a source of vapor-phase solvent. The autoclave and fill tube(s) may be cooled, or the solvent delivery system and transfer lines heated, so that the former are cooler by between one and 50 degrees Celsius than the latter. Vapor-phase solvent is then introduced into the autoclave at a rate between 0.1 and 1000 grams per minute and allowed to condense in the autoclave. The pressure of the solvent vapor should be higher than the equilibrium vapor pressure at the temperature of the autoclave. Depending on the temperature of the autoclave and of the solvent delivery system, the pressure during solvent delivery may be above 7 atmospheres, above 8 atmospheres, above 9 atmospheres, or above 10 atmospheres. In one embodiment, the purge exhaust is closed and the solvent vapor above the liquid is forced to condense into liquid during the filling operation. In this embodiment, the autoclave may be actively cooled in order to dissipate the heat released by condensation of the solvent vapor. In another embodiment, the purge exhaust is fitted with a check valve so that residual purge gas or solvent vapor is allowed to exit when the pressure exceeds a predetermined threshold, but air or other gases are not allowed to flow backward into the autoclave. The quantity of solvent in the autoclave may be determined by using a vapor delivery system equipped with a mass flow meter. In some embodiments, the amount of ammonia delivered to the autoclave is quantified by the loss in weight of at least one ammonia supply cylinder. If solvent gas is allowed to exhaust during liquid filling, in the case where ammonia is the solvent, the quantity of vented solvent may be determined by trapping it in aqueous solution and measuring the change in pH and this quantity subtracted from the total liquid delivered to determine the quantity of liquid in the capsule. An analogous method for determining the quantity of vented solvent may be performed in cases where the solvent is different from ammonia.

Following filling of the autoclave, the inner purge tube, if present, may be removed. In some embodiments, the inner purge tube is removed after the purging step but before the filling step. A gate valve to the autoclave is then sealed. Once sealed, the interior of the autoclave is substantially air-free, and the at least one material contained therein can be processed with reduced risk of contamination. Of course, there can be other variations, modifications, and alternatives.

In some embodiments, the autoclave is then heated to crystal growth conditions. In some embodiments, the thermal cycle includes a pre-reaction segment to form mineralizer, polycrystalline gallium nitride, dissolved gallium containing complexes, or the like. In some embodiments, the atmosphere in the autoclave may be modified during the run. For example, excess $H_2$ formed by reaction of gallium metal with ammonia may be bled off through the gate valve or allowed to diffuse through a heated palladium membrane. The use of a commercially-available heated palladium membrane offers the convenience of continuous hydrogen removal, without interrupting or perturbing the process, with little or no opportunity for contamination of the process. Excess nitrogen formed by decomposition of an azide mineralizer may be bled off through the gate valve. Additional ammonia may be added to replenish the solvent in the high pressure apparatus.

After performing crystal growth for a predetermined period of time, the autoclave is cooled. When the autoclave has cooled to below 100 degrees Celsius, below 75 degrees Celsius, below 50 degrees Celsius, or below 35 degrees Celsius, a valve to the autoclave is opened and the ammonia is removed. In a specific embodiment, gas-phase ammonia is allowed to exit the autoclave and is bubbled through an acidic aqueous solution in order to be chemically trapped. In another embodiment, gas phase ammonia is passed through a flame so as to burn the ammonia, forming $H_2O$ and $N_2$. In a preferred embodiment, illustrated in FIGS. 6A and 6B, the ammonia is trapped for recycling and reuse.

Referring to FIG. 6A, appropriate for a single-ended autoclave, the ammonia may be removed as either a liquid or a gas. To remove the ammonia as a liquid, the inner purge tube (see FIG. 3) is re-inserted into the outer purge or fill tube and the outlet of the inner purge tube connected to the Receiving/Purification tank. Keeping the purge gas exhaust connection (see FIG. 3) closed, a valve in the line to the inner purge tube is opened, allowing liquid ammonia to flow through the inner purge tube in the autoclave into the Receiving/Purification tank, which is otherwise closed. The Receiving/Purification tank may be cooled, for example, by chilled water, and/or the autoclave and transfer line may be heated during the ammonia transfer operation, so as to maintain a higher vapor pressure of ammonia in the autoclave as compared to the vapor pressure in the Receiving/Purification tank. The temperature differential between the autoclave and the Receiving/Purification tank may be held between one and 50 degrees Celsius. In another embodiment, the ammonia is removed as a vapor. The outlet of the autoclave is connected to a condenser above the Receiving/Purification tank and a valve opened. Gas-phase ammonia enters the condenser and condenses into liquid in a heat-exchanger, for example, a chilled-water-cooled coil, at a pressure between about 100 and 250 pounds per square inch. The autoclave and transfer line may be heated to a temperature that is higher than the condenser by between one and 50 degrees Celsius. Residual gases, for example, $N_2$ and $H_2$, may be released by venting to a scrubber and/or a flame.

Referring to FIG. 6B, appropriate for a double-ended autoclave, the ammonia may be removed as a liquid. A port on the bottom end of the autoclave is connected to the Receiving/Purification tank and a valve opened, allowing liquid ammonia to flow into the Receiving/Purification tank, which is otherwise closed. The Receiving/Purification tank may be cooled, for example, by chilled water, and/or the autoclave and transfer line may be heated during the ammonia transfer operation, so as to maintain a higher vapor pressure of ammonia in the autoclave as compared to the vapor pressure in the Receiving/Purification tank. The temperature differential between the autoclave and the Receiving/Purification tank may be held between one and 50 degrees Celsius.

For recycling purposes, a purifying agent, for example, sodium metal, may be placed in the receiving/purification tank. The sodium will react with residual oxygen and/or water in the ammonia, restoring a very high degree of purity. After a period of one hour to thirty days, the ammonia may be transferred to a delivery tank. In a preferred embodiment, the transfer is performed through the gas phase, via a condenser, so as to leave the purifying agent in the receiving/purification tank. Liquid ammonia may be delivered from the delivery tank, via a dip tube, to the autoclave for the next crystal growth run. In an alternative embodiment, vapor-phase ammonia may be delivered from the delivery tank to the autoclave for the next crystal growth run.

After removing the ammonia, the autoclave is opened and grown crystals and remaining raw material removed. The crystals may be sliced in a predetermined orientation to form at least one wafer. After slicing, the crystal wafers may be lapped, polished, and chemical-mechanically polished by methods that are known in the art.

In a specific embodiment, any of the above sequence of steps provides a method according to an embodiment of the present invention. In a specific embodiment, the present invention provides a method and resulting crystalline material provided by an autoclave apparatus having means for filling with a solvent at elevated pressure. Other alternatives can also be provided where steps are added, one or more steps are removed, or one or more steps are provided in a different sequence without departing from the scope of the claims herein.

While the above is a full description of the specific embodiments, various modifications, alternative constructions and equivalents may be used. As an example, the present method and system uses a pressure of about 7 atmospheres and greater, but other suitable pressures or specific pressures may exist. In one or more embodiment, the pressure may be slightly higher or lower depending upon the application. Therefore, the above description and illustrations should not be taken as limiting the scope of the present invention which is defined by the appended claims.

What is claimed is:

1. A process for growing a crystalline gallium-containing nitride, the process comprising:
   providing a high pressure apparatus;
   providing a capsule comprising gallium-containing feedstock in one zone and at least one seed in another zone;
   while maintaining an elevated pressure within the capsule, introducing a solvent capable of forming a supercritical fluid into at least the one zone and the other zone;
   placing the capsule within the high pressure apparatus;
   processing one or more portions of the gallium-containing feedstock in the supercritical fluid to provide a supercritical solution comprising at least gallium containing species at a first temperature; and
   growing crystalline gallium-containing nitride material from the supercritical solution on the seed at a second temperature, the second temperature being characterized to cause the gallium containing species to form the crystalline gallium containing nitride material on the seed.

2. The process of claim 1, wherein the solvent capable of forming a supercritical fluid is introduced into the capsule at an elevated pressure of at least about seven (7) atmospheres.

3. The process of claim 1, wherein the introduction of the solvent occurs while the solvent is substantially in liquid form.

4. The process of claim 1, wherein the high pressure apparatus comprises an autoclave.

5. The process of claim 1, further comprising purging or evacuation followed by back-filling the capsule prior to introducing the solvent.

6. The process of claim 3, further comprising introducing thermal energy into the capsule during the purging or evacuation followed by back-filling.

7. The process of claim 6, wherein the thermal energy provides a temperature between 25 and 500 degrees Celsius during the purging or evacuation followed by back-filling.

8. The process of claim 5 further comprising performing a purging or back-filling process of the capsule using solvent vapor.

9. The process of claim 1, wherein the high pressure apparatus has an inner diameter greater than 100 mm.

10. The process of claim 9, wherein the high pressure apparatus has an inner diameter greater than 150 mm.

11. The process of claim 10, wherein the high pressure apparatus has an inner diameter greater than 200 mm.

12. A process for growing a crystalline gallium-containing nitride, the process comprising:
   providing an autoclave or a capsule comprising gallium-containing feedstock in one zone and at least one seed in another zone;
   while maintaining an elevated pressure within the autoclave or capsule, introducing a first solvent capable of forming a supercritical fluid into at least the one zone and the other zone;
   processing one or more portions of the gallium-containing feedstock in the supercritical fluid to provide a supercritical solution comprising at least gallium containing species at a first temperature;
   growing crystalline gallium-containing nitride material from the supercritical solution on the seed at a second temperature, the second temperature being characterized to cause the gallium containing species to form the crystalline gallium containing nitride material on the seed;
   removing thermal energy from the autoclave or capsule to form a second solvent from the supercritical solution; and
   removing the second solvent from the autoclave or capsule through an outlet; and
   transferring the second solvent from the outlet to a purification process.

13. The process of claim 12 wherein the solvent capable of forming a supercritical fluid is introduced into the capsule at an elevated pressure of at least about seven (7) atmospheres.

14. The process of claim 12 further comprising transferring the second solvent from the outlet to a purification process to recycle the second solvent.

15. The process of claim 12 further comprising transferring the second solvent from the outlet to a purification process to recycle the second solvent; purifying the second solvent in the purification process to form a third solvent; and transferring the third solvent to the autoclave or capsule.

16. The process of claim 15 wherein the third solvent is substantially the same as the first solvent.

17. The process of claim 12 wherein the second solvent comprises a hydrogen species, nitrogen species, one or more trace metals, and dissolved mineralizer.

18. The process of claim 12 wherein the first solvent is substantially $NH_3$.

* * * * *